US011544063B2

(12) United States Patent
Lee et al.

(10) Patent No.: US 11,544,063 B2
(45) Date of Patent: *Jan. 3, 2023

(54) MEMORY SYSTEM AND DATA PROCESSING SYSTEM INCLUDING THE SAME

(71) Applicant: SK hynix Inc., Icheon (KR)

(72) Inventors: Dong Uk Lee, Seoul (KR); Seung Gyu Jeong, Gwangmyeong (KR); Dong Ha Jung, Yongin (KR)

(73) Assignee: SK hynix Inc., Icheon (KR)

( * ) Notice: Subject to any disclaimer, the term of this patent is extended or adjusted under 35 U.S.C. 154(b) by 126 days.

This patent is subject to a terminal disclaimer.

(21) Appl. No.: 16/860,850

(22) Filed: Apr. 28, 2020

(65) Prior Publication Data
US 2020/0257530 A1 Aug. 13, 2020

Related U.S. Application Data

(63) Continuation-in-part of application No. 16/383,371, filed on Apr. 12, 2019, now Pat. No. 10,963,395, and
(Continued)

(30) Foreign Application Priority Data

Nov. 21, 2018  (KR) .................. 10-2018-0144288
Nov. 30, 2018  (KR) .................. 10-2018-0152527
Nov. 30, 2018  (KR) .................. 10-2018-0152528

(51) Int. Cl.
G06F 9/30         (2018.01)
G06F 9/48         (2006.01)
(Continued)

(52) U.S. Cl.
CPC ........ *G06F 9/30047* (2013.01); *G06F 9/4818* (2013.01); *G06F 12/0246* (2013.01);
(Continued)

(58) Field of Classification Search
CPC .............. G06F 9/30047; G06F 9/4818; G06F 12/0246; G06F 12/0882; G06F 13/1663;
(Continued)

(56) References Cited

U.S. PATENT DOCUMENTS 5,434,533 A * 7/1995 Furutani ................ G11C 5/147
                                                     323/907
5,717,884 A * 2/1998 Gzym .................. G06F 12/0866
                                                   711/E12.019
(Continued)

FOREIGN PATENT DOCUMENTS

KR     20140067740      6/2014
KR     20190074823 A    6/2019

OTHER PUBLICATIONS

Somogyi, et al., "Spatio-Temporal Memory Streaming," ISCA, Proceedings of the 36th Annual International Symposium on Computer Architecture, 2009, 12 pages.

*Primary Examiner* — Phong H Dang

(57) ABSTRACT

A data processing system includes a compute blade generating a write command to store data and a read command to read the data, and a memory blade. The compute blade has a memory that stores information about performance characteristics of each of a plurality of memories, and determines priority information through which eviction of a cache line is carried out based on the stored information.

18 Claims, 24 Drawing Sheets

Related U.S. Application Data a continuation-in-part of application No. 16/352,676, filed on Mar. 13, 2019, now Pat. No. 10,762,012, and a continuation-in-part of application No. 16/288,015, filed on Feb. 27, 2019, now Pat. No. 10,860,498.

(51) Int. Cl.

| | | |
|---|---|---|
| *G06F 12/0882* | (2016.01) | |
| *G06F 12/02* | (2006.01) | |
| *G11C 5/02* | (2006.01) | |
| *G11C 29/42* | (2006.01) | |
| *G11C 29/44* | (2006.01) | |
| *G11C 11/4093* | (2006.01) | |
| *G06F 13/16* | (2006.01) | |

(52) U.S. Cl.
CPC ...... *G06F 12/0882* (2013.01); *G06F 13/1663* (2013.01); *G11C 5/025* (2013.01); *G11C 11/4093* (2013.01); *G11C 29/42* (2013.01); *G11C 29/44* (2013.01)

(58) Field of Classification Search
CPC ..... G11C 5/025; G11C 11/4093; G11C 29/42; G11C 29/44
See application file for complete search history.

(56) References Cited

U.S. PATENT DOCUMENTS

| | | | |
|---|---|---|---|
| 7,206,902 B2 | 4/2007 | Hakura et al. | |
| 7,606,982 B2 | 10/2009 | Hwang | |
| 8,095,738 B2 | 1/2012 | Benhase et al. | |
| 8,200,911 B2 | 6/2012 | Jeong | |
| 8,433,852 B2 | 4/2013 | Hu et al. | |
| 8,792,511 B2 | 7/2014 | Raikar et al. | |
| 9,612,975 B2 | 4/2017 | Li | |
| 10,860,498 B2* | 12/2020 | Jeong | G06F 12/123 |
| 2011/0129225 A1* | 6/2011 | Gostin | H04B 10/801 |
| | | | 398/66 |
| 2012/0311269 A1* | 12/2012 | Loh | G06F 12/126 |
| | | | 711/E12.017 |
| 2012/0317356 A1 | 12/2012 | Ignatowski | |
| 2013/0290643 A1* | 10/2013 | Lim | G06F 16/24552 |
| | | | 711/144 |
| 2014/0068209 A1* | 3/2014 | Lim | G06F 12/08 |
| | | | 711/E12.103 |
| 2014/0115225 A1* | 4/2014 | Chandrakar | G06F 12/121 |
| | | | 711/6 |
| 2014/0149653 A1* | 5/2014 | Udipi | G06F 12/08 |
| | | | 711/202 |
| 2014/0149694 A1 | 5/2014 | Lee et al. | |
| 2018/0113815 A1* | 4/2018 | Eckert | G06F 12/126 |

\* cited by examiner

MEMORY SYSTEM AND DATA PROCESSING SYSTEM INCLUDING THE SAME

CROSS-REFERENCE TO RELATED APPLICATIONS

The present application is a continuation in part of U.S. application Ser. No. 16/288,015, filed on Feb. 27, 2019, U.S. application Ser. No. 16/383,371, filed on Apr. 12, 2019, and U.S. application Ser. No. 16/352,676, filed on Mar. 13, 2019, which respectively claim priority under 35 U.S.C. § 119(a) to Korean application number 10-2018-0144288, filed on Nov. 21, 2018, Korean application number 10-2018-0152527, filed on Nov. 30, 2018, and Korean application number 10-2018-0152528, filed on Nov. 30, 2018, in the Korean Intellectual Property Office, each of which is incorporated herein by reference in its entirety.

BACKGROUND

1. Technical Field

Embodiments of the present disclosure may generally relate to a data processing system, and more particularly to a technology for implementing a convergence memory system provided with a plurality of memories.

2. Related Art

In recent times, various mobile communication terminals, for example, smartphones, tablet PCs, etc. have been widely used throughout the world. In addition, demand for a Social Network Service (SNS), a Machine to Machine (M2M) service, a sensor network, etc. accessible from anywhere at any time is rapidly increasing. Therefore, the amount of data, the speed of creating data, and diversity of data are geometrically increasing. In order to process increasing quantities of data, data processing rates of memory are important, and a high-capacity memory device and a high-capacity memory module are also needed.

Therefore, a memory system includes a plurality of memory devices to increase storage capacity. However, the plurality of memory devices contained in the memory system may have different memory characteristics. Therefore, when cache management is executed in the memory system, memory devices with different memory characteristics can cause access errors, resulting in miss penalties in a memory system.

BRIEF SUMMARY

Various embodiments of the present disclosure are directed to providing a data processing system that substantially obviates one or more issues due to limitations and disadvantages of the related art.

The embodiments of the present disclosure relate to a memory system for assigning priority information in response to memory characteristics during eviction of one or more cache lines, resulting in reduction in a miss penalty.

The embodiments of the present disclosure relate to a memory system for analyzing requests by a host, predicting data that may be subsequently accessed by the host, and transmitting data selected according to the prediction from among data of an entire page, thus reducing overhead.

Embodiments of the present disclosure relate to a memory system in which each memory includes a shared channel, such that a plurality of chips contained in the memory system may share the memory through the shared channel.

In accordance with an embodiment of the present disclosure, a data processing system includes a compute blade configured to generate a write command needed to store data and a read command needed to read the data, and a memory blade configured to selectively perform read and write operations in response to the read and write commands in a plurality of memories. The compute blade has a cache memory that stores information about performance characteristics of each of the plurality of memories, and is configured to determine priority information through which eviction of a cache line is carried out based on the stored information.

In accordance with an embodiment of the present disclosure, a memory system includes a host configured to generate memory information by profiling history information about a memory access pattern, and at least one memory device configured to predict a data pattern of a page to be accessed by the host, using the memory information, generate subset data from the pattern according to the predicted data pattern, and transmit the generated subset data to the host, wherein the subset data is less than all the data of the page.

In accordance with another embodiment of the present disclosure, a memory system includes a memory device, a memory profile circuit configured to generate memory information by profiling history information about a memory access pattern, and a data prediction circuit configured to predict a data pattern of a page to be accessed by the host, using the memory information, and generate subset data of the page according to the predicted data pattern wherein the subset data is less than all the data of the page.

In accordance with an embodiment of the present disclosure, a memory system includes a first chip configured to perform a first operation, a second chip configured to perform a second operation, and a stacked memory device configured to include a stacked structure of a plurality of memories. The stacked memory device being configured to be accessed by the first chip and the second chip through a shared bus.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The above and other features and advantages of the present disclosure will become readily apparent by reference to the following detailed description when considered in conjunction with the accompanying drawings wherein.

DESCRIPTION OF EMBODIMENTS

Reference will now be made in detail to embodiments of the present disclosure, examples of which are illustrated in the accompanying drawings. Wherever possible, the same reference numbers are used throughout the drawings to refer to the same or like portions. Throughout the specification of the present disclosure, if it is assumed that a certain part is connected (or coupled) to another part, the term "connection or coupling" means that the certain part is directly connected (or coupled) to another part and/or is electrically connected (or coupled) to another part through the medium of a third party. Throughout the specification of the present disclosure, if it is assumed that a certain part includes a certain component, the term "comprising or including" means that a corresponding component may further include other components unless a specific meaning opposed to the corresponding component is written. As used in the specification and appended claims, the terms "a", "an", "one", "the" and other similar terms include both singular and plural forms, unless context clearly dictates otherwise. The terms used in the present application are merely used to describe specific embodiments and are not intended to limit the present disclosure. A singular expression may include a plural expression unless otherwise stated in the context.

Figure 1:
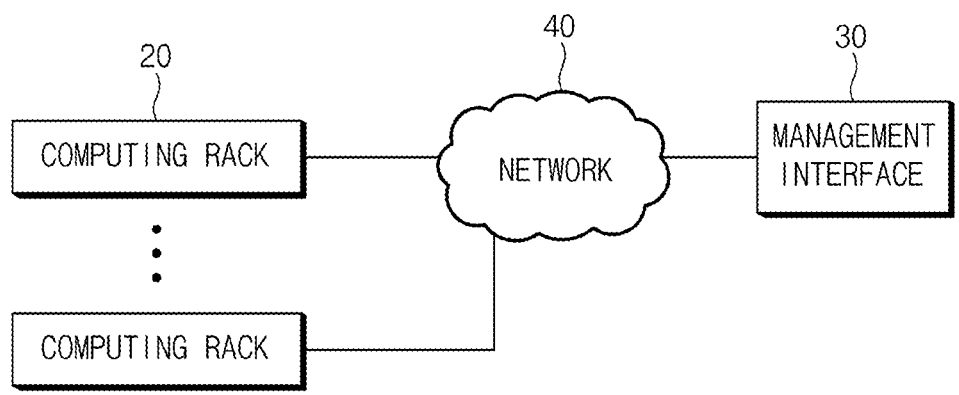
FIG. 1 is a block diagram illustrating an example of a data processing system according to an embodiment of the present disclosure.

FIG. 1 is a block diagram illustrating an example of a data processing system 10 according to an embodiment of the present disclosure.

Referring to FIG. 1, the data processing system 10 may include a plurality of computing racks 20, a management interface 30, and a network 40 through which the computing racks 20 and the management interface 30 can communicate with each other. The data processing system 10 provided with such a rack-scale architecture may be used in a data center for processing a large amount of data, or the like.

Each of the computing racks 20 may independently implement a single computing device. Alternatively, each of the computing racks 20 may be combined with other computing racks, resulting in implementation of a single computing device. Detailed constituent elements and operations of the computing racks 20 will be described later with reference to the attached drawings.

The management interface 30 may provide an interactive interface through which a user can coordinate, administer, or manage the data processing system 10. The management interface 30 may be implemented as an arbitrary computing device including various kinds of devices, for example, a computer, a system, a server, a rack-mount server, a blade server, a laptop, a tablet PC, a wearable computing device, a network device, a Web device, a distributed computing system, a processor based system, and/or a consumer electronic device.

In accordance with one embodiment, the management interface 30 may be implemented as a distributed system having either compute functions capable of being executed by the computing racks 20, or user interface (UI) functions capable of being executed by the management interface 30. In accordance with another embodiment, the management interface 30 may be implemented as a virtual server which is composed of multiple computing devices distributed through the network 40 and operates as a cloud device. In this case, the management interface 30 may include a processor, an input/output (I/O) sub system, a memory, a data storage device, and a communication circuit.

The network 40 may perform data communication between the management interface 30 and each of the computing racks 20, and/or may perform data communication between the computing racks 20. The network 40 may be a wired or wireless network, or have a combination of wired and wireless elements.

The network 40 may be a wired or wireless Local Area Network (LAN), a Wide Area Network (WAN) cellular network, and/or a publicly-accessible global network such as the Internet. In addition, the network 40 may include a number of network devices such as computers, routers, switches, etc.

Figure 2:
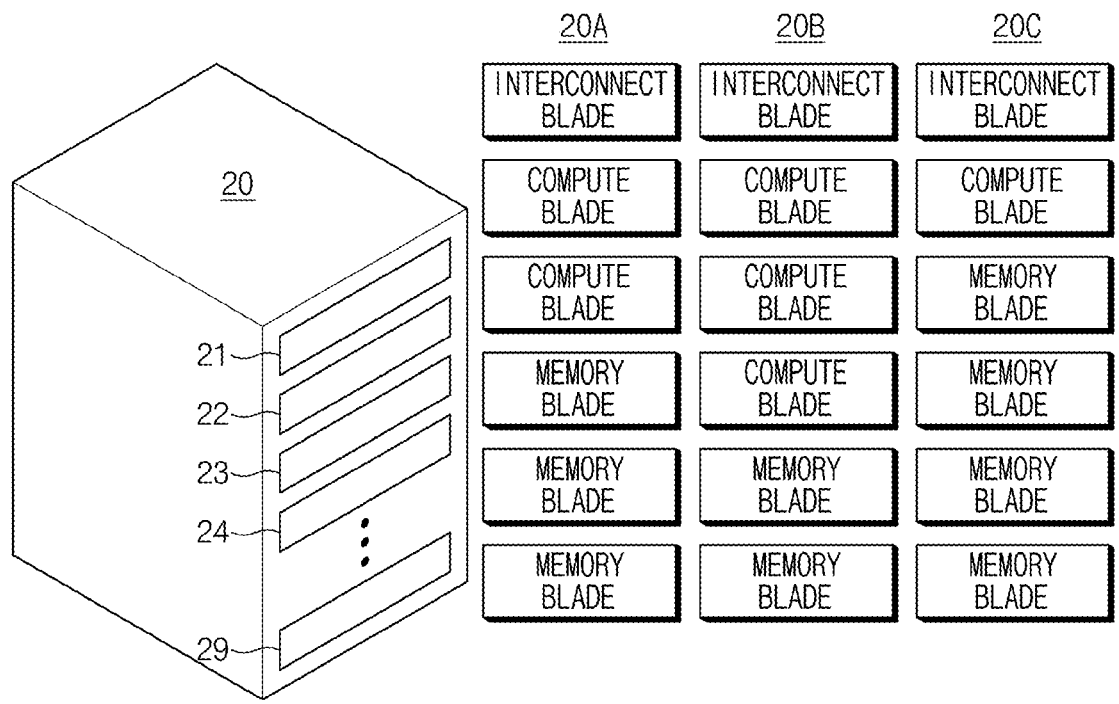
FIG. 2 is a block diagram illustrating an example of a computing rack shown in FIG. 1 according to an embodiment of the present disclosure.

FIG. 2 is a block diagram illustrating a computing rack shown in FIG. 1 according to an embodiment of the present disclosure.

Referring to FIG. 2, the scope of the computing rack 20 is not limited to the specific structures, shapes, names, etc. shown in the figure, and it should be noted that the computing rack 20 may include various components. For example, the computing rack 20 may include a plurality of drawers 21 to 29. Each of the drawers 21 to 29 may include a plurality of modules, and each of the modules may include a plurality of blades.

In accordance with one embodiment, the computing rack 20 may be implemented by a combination of one or more compute blades, one or more memory blades, and/or one or more interconnect blades. Although the term "computing rack" is used by the present disclosure to refer to a combination of the plurality of blades, it should be noted that the computing rack may also be referred to as by other names, for example, drawers, modules, trays, boards, chassis, units, or the like.

The components of a computing rack 20 may be sorted or classified according to their functions. Although the scope of the present disclosure is not limited to any specific embodiment, the computing rack 20 may include one interconnect blade, at least one compute blade, and at least one memory blade in a downward direction.

In various embodiments, a computing device may be implemented by a single computing rack 20. Alternatively, the computing device may be implemented by all blades contained in at least two computing racks 20, by a combination of a portion of the blades contained in at least two computing racks 20, or a portions of the blades in a single computing rack 20.

In accordance with various embodiments, the computing device may be implemented by a combination of compute blades, memory blades, and interconnect blades contained in the computing rack 20. For example, the computing device 20A may include a combination of two compute blades, three memory blades, and a single interconnect blade. In another example, the computing device 20B may include a combination of three compute blades, two memory blades, and a single interconnect blade. In yet another example, the computing device 20C may include a combination of a single compute blade, four memory blades, and a single interconnect blade.

Although FIG. 2 illustrates a computing rack 20 that includes a plurality of compute blades, memory blades, and interconnect blades, the scope of the present disclosure is not limited thereto. The computing rack 20 may include additional constituent elements that are present in a general server, for example, a power system, a cooling system, input/output (I/O) devices, etc.

Figure 3:
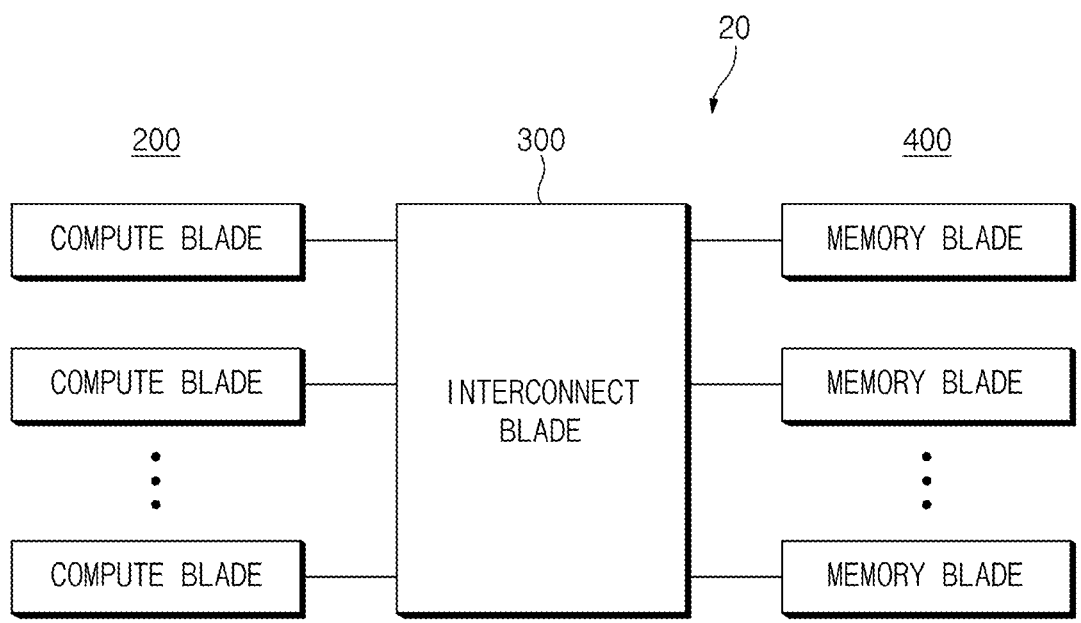
FIG. 3 is a block diagram illustrating an example of a computing rack shown in FIG. 1 according to an embodiment of the present disclosure.

FIG. 3 is a block diagram illustrating the computing rack 20 shown in FIG. 1 according to an embodiment of the present disclosure.

Referring to FIG. 3, the computing rack 20 may include a plurality of compute blades 200, an interconnect blade 200, and a plurality of memory blades 400.

In this case, the plurality of compute blades 200 may be referred to as pooled compute blades, pooled compute systems, or the like. Similarly, the plurality of memory blades 400 may also be referred to as pooled memory blades, pooled memory system, or the like. Each of the compute blades 200 may generate a write command to store data and a read command to read data. Each compute blade 200 may include at least one processing element, for example, at least one processor, at least one processing/control circuit, or at least one central processing unit (CPU).

Each of the memory blades 400 may selectively perform a read or write operation of data in response to a read command or a write command. In more detail, each memory blade 400 may perform a read operation to read data in response to the read command, and may perform the write operation to write data in response to the write command. Each memory blade 400 may include various types of memories, for example, a plurality of volatile memories and/or a plurality of non-volatile memories.

In an embodiment, each of the memory blades 400 may include a plurality of Dynamic Random Access Memories (DRAMs), flash memories, memory cards, Hard Disk Drives (HDDs), Solid State Drives (SSDs), or a combination thereof.

Each of the memory blades 400 may be divided, allocated, or designated by one or more processors contained in each compute blade 200. Each memory blade 400 may store at least one operating system (OS) capable of being initialized and/or performed by the compute blades 200.

The interconnect blade 300 may have a plurality of network interface ports, cards, or switches. The interconnect blade 300 may use protocols related to one or more wired or wireless communication technologies. For example, the interconnect blade 300 may support data communication between each of the compute blades 200 and each of the memory blades 400 according to various protocols such as Peripheral Component Interconnect Express (PCIe), Quick-Path Interconnect (QPI), Ethernet, and the like.

A server system or a data processing system, such as a data center, may have a plurality of blades (e.g., compute blades 200, memory blades 400, etc.) mounted into a unit computing rack 20 while simultaneously being distinguished from one another within the computing rack 20. A single memory blade or multiple memory blades may be implemented as a convergence memory device in which the same or different kinds of memories are provided, or may also be implemented as a pooled memory system.

Figure 4:
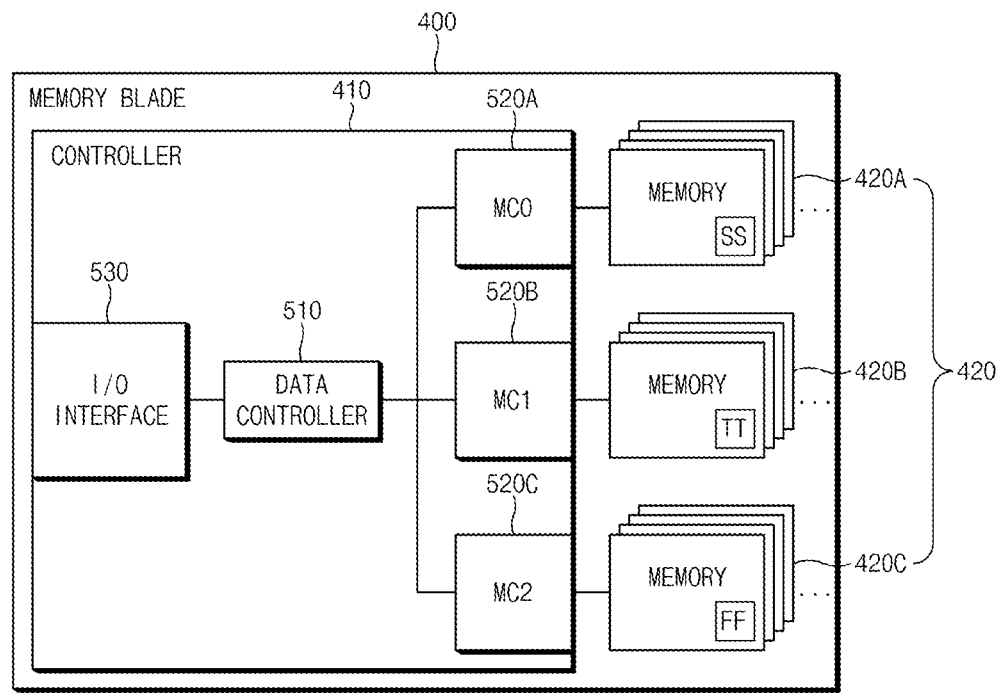
FIG. 4 is a schematic diagram illustrating an example of a memory blade shown in FIG. 3 according to an embodiment of the present disclosure.

FIG. 4 is a schematic diagram illustrating each memory blade shown in FIG. 3 according to an embodiment of the present disclosure.

Referring to FIG. 4, the memory blade 400 may include a controller 410 and a plurality of memories 420.

The controller 410 may include a data controller 510, a plurality of memory controllers 520A~520C, and an Input/Output (I/O) interface 530.

The data controller 510 may control data which is communicated between the compute blades 200 shown in FIG. 3 and the memories 420. For example, the data controller 510 may receive data to be written, from the compute blades 200 in response to a write request or a write command. The data controller 510 may control the write operation for writing the received data in a corresponding memory from among the plurality of memories 420. In another example, the data controller 510 may read data stored in a specific memory from among the plurality of memories 420 in response to a read request or a read command from the compute blades 200. The data controller 510 may control a read operation for outputting read data to the corresponding compute blade from among the compute blades 200.

The memory controllers 520A-520C may be disposed between the data controller 510 and the plurality of memories 420, and may provide an interface between the data controller 510 and the memories 420. The memory controller 520A may control operations of a first group of memories 420A contained in the plurality of memories 420. The memory controller 520B may control operations of a second group of memories 420B contained in the plurality of memories 420. The memory controller 520C may control operations of a third group memories 420C contained in the plurality of memories 420.

Accordingly, the memory controller 520A may be disposed between the data controller 510 and the first group of memories 420A, and may support data communication between the data controller 510 and the first group of memories 420A. The memory controller 520B may be disposed between the data controller 510 and the second group of memories 420B, and may support data communication between the data controller 510 and the second group of memories 420B. The memory controller 520C may be disposed between the data controller 510 and the third group of memories 420C, and may support data communication between the data controller 510 and the third group of memories 420C.

As can be seen from FIG. 4, the controller 410 may exemplarily include three memory controllers 520A-520C for convenience of description. However, the scope of the present disclosure is not limited thereto. In some embodiments, the controller 410 has one memory controller 520 for each type of memory 420. If the first-group memories 420A, the second-group memories 420B, and the third-group memories 420C are the same kind of memories, the controller 410 may have a single memory controller.

The I/O interface 530 may provide an interface between the data controller 510 and the compute blades 200 through the interconnect blade 300. The I/O interface 530 may transmit (Tx) data received from the data controller 510 to the interconnect blade 300 using protocols related to at least one wired or wireless communication technology, and may receive (Rx) data from the interconnect blade 300 and transmit the receive data to the data controller 510.

For example, the I/O interface 530 may support data communication between the data controller 510 and the interconnect blade 300 according to various protocols such as Peripheral Component Interconnect Express (PCIe), QuickPath Interconnect (QPI), Ethernet, and the like.

In response to a control signal received from the controller 410, the plurality of memories 420 may store (or write) data, or may output (or read) the stored data. The plurality of memories 420 may include the first-group memories 420A, the second-group memories 420B, and the third-group memories 420C. The first-group memories 420A, the second-group memories 420B, and the third-group memories 420C may have the same or different characteristics.

In accordance with some embodiments, the first-group memories 420A, the second-group memories 420B, and the third-group memories 420C may have the same or different latency characteristics.

For example, the first-group memories 420A, the second-group memories 420B, and the third-group memories 420C may be DRAM memories with the same characteristics. Alternatively, the first-group memories 420A, the second-group memories 420B, and the third-group memories 420C may be another type of memories, for example, Static Random Access Memories (SRAMs) or flash memories. In addition, the first-group memories 420A, the second-group memories 420B, and the third-group memories 420C may also be implemented as different types of memories.

In accordance with other embodiments, the same kind of memories 420, e.g., volatile memories (DRAMs), contained in the memory blade 400 may share or indicate various performance characteristics according to various temperature environments. In this case, the performance characteristics may include data access speed, a refresh period, or an amount of On-Chip leakage.

That is, the first-group memories 420A, the second-group memories 420B, and the third-group memories 420C may be in different temperature environments. The first-group memories 420A may operate in a first temperature environment, e.g., a room-temperature environment. The second-group memories 420B may operate in a second temperature environment, e.g., a low-temperature environment. The third-group memories 420C may operate in a third temperature environment, e.g., an ultralow-temperature (cryogenic) environment.

For example, when the third-group memories 420C operate in the cryogenic environment, the operating speed of the volatile memories (e.g., DRAMs) may be faster. In addition, as the amount of on-chip leakage decreases, the refresh period may be extended, thereby reducing a total amount of energy consumed by the volatile memory used in the cryogenic environment. As described above, the volatile memory used in the cryogenic environment may have the same characteristics as the non-volatile memory. In an embodiment, in response to a request signal requesting the best system performance, the third-group memories 420C disposed in the cryogenic environment may be selected from among the plurality of memories 420. As a result, the memory blade 400 shown in FIG. 4 may more quickly cope with a request signal (e.g., an urgent request signal) having a relatively higher priority, and at the same time may greatly reduce power consumption.

If a request signal requesting satisfactory system performance is received by a memory controller, the second-group memories 420B may be selected. In addition, when the first-group memories 420A operate in a higher temperature environment such as the room-temperature environment, the operation speed of the volatile memory is reduced. As the amount of on-chip leakage increases, power consumption may also increase in proportion to the increasing on-chip leakage.

Therefore, the first-group memories 420A, the second-group memories 420B, and the third-group memories 420C may be used in environments of various temperatures, resulting in implementation of various performance characteristics. Therefore, the first-group memories 420A may be set to memories operating in the room-temperature environment, each of which has first characteristics (e.g., slow characteristics: SS) corresponding to a slow operation speed. The second-group memories 420B may be set to memories operating in the low-temperature environment, each of which has second characteristics (e.g., normal characteristics: TT) corresponding to a normal operation speed. The third-group memories 420C may be set to memories operating in the ultralow-temperature (cryogenic) environment, each of which has third characteristics (e.g., fast characteristics: FF) corresponding to a fast operation speed.

Figure 5:
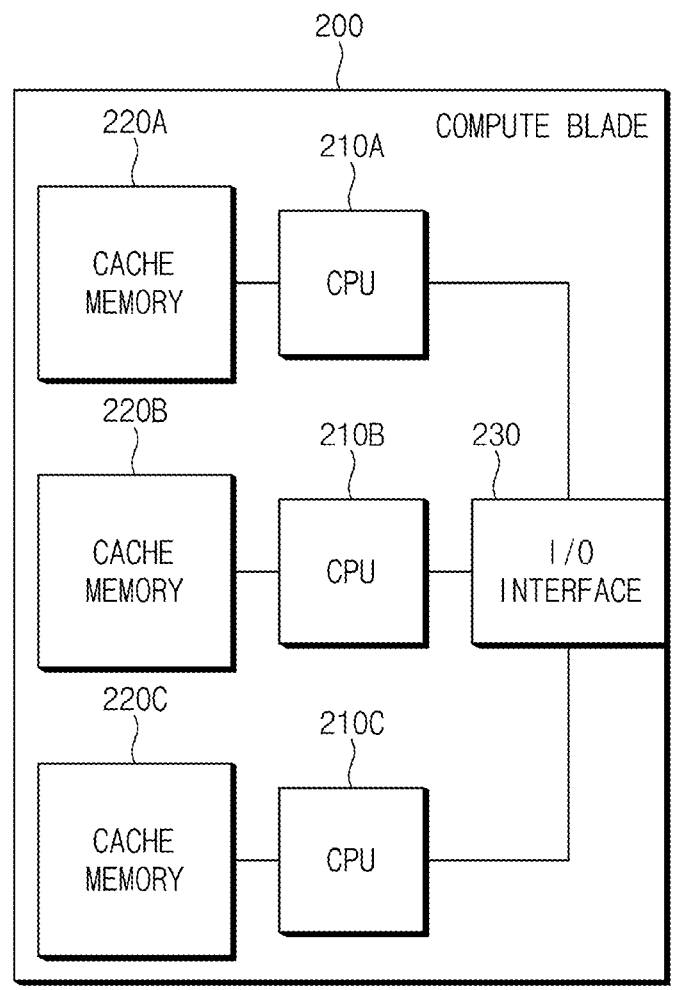
FIG. 5 is a schematic diagram illustrating an example of a compute blade shown in FIG. 3 according to an embodiment of the present disclosure.

FIG. 5 is a schematic diagram illustrating the compute blade shown in FIG. 3 according to an embodiment of the present disclosure.

Referring to FIG. 5, the compute blade 200 may include one or more CPUs 210A-210C, one or more cache memories 220A~220C, and an I/O interface 230.

Each of the CPUs 210A~210C may generate a command for controlling at least one memory blade 400. Each of the CPUs 210A~210C may be used to divide, allocate, or designate at least one memory blade 400 from among the plurality of memory blades 400 shown in FIG. 3. Each of the CPUs 210A~210C may initialize at least one divided, allocated, or designated memory blade 400. Each of the CPUs 210A~210C may control the read or write operation (or the read or write program) performed in the plurality of memory blades 400.

For latency reduction, the cache memory 220A may store data for the CPU 210A, the cache memory 220B may store for the CPU 210B, and the cache memory 220C may store data for the CPU 210C. The cache memories 220A~220C may store data used to operate the CPUs 210A~210C in cache lines, and may determine priority information for each memory in which an eviction operation is performed according to characteristics of the respective memories 420. In accordance with one embodiment, the cache memories 220A~220C may be coupled to the CPUs 210A~210C on a one to one basis. For example, the cache memories 220A~220C may be disposed on respective processor dies for CPUs 210A~210C.

The I/O interface 230 may support communications between the memory blades 400 and the CPUs 210A~210C through the interconnect blade 300 shown in FIG. 3.

The I/O interface 230 may control data input/output (I/O) operations using protocols related to at least one wired or wireless communication technology. That is, the I/O interface 230 may output transmission (Tx) data received from the CPUs 210A~210C to the interconnect blade 300, and may transmit reception (Rx) data received from the interconnect blade 300 to the CPUs 210A~210C.

For example, the I/O interface 230 may support data communication between the interconnect blade 300 and the CPUs 210A-210C according to various protocols such as Peripheral Component Interconnect Express (PCIe), Quick-Path Interconnect (QPI), Ethernet, and the like.

Figure 6:
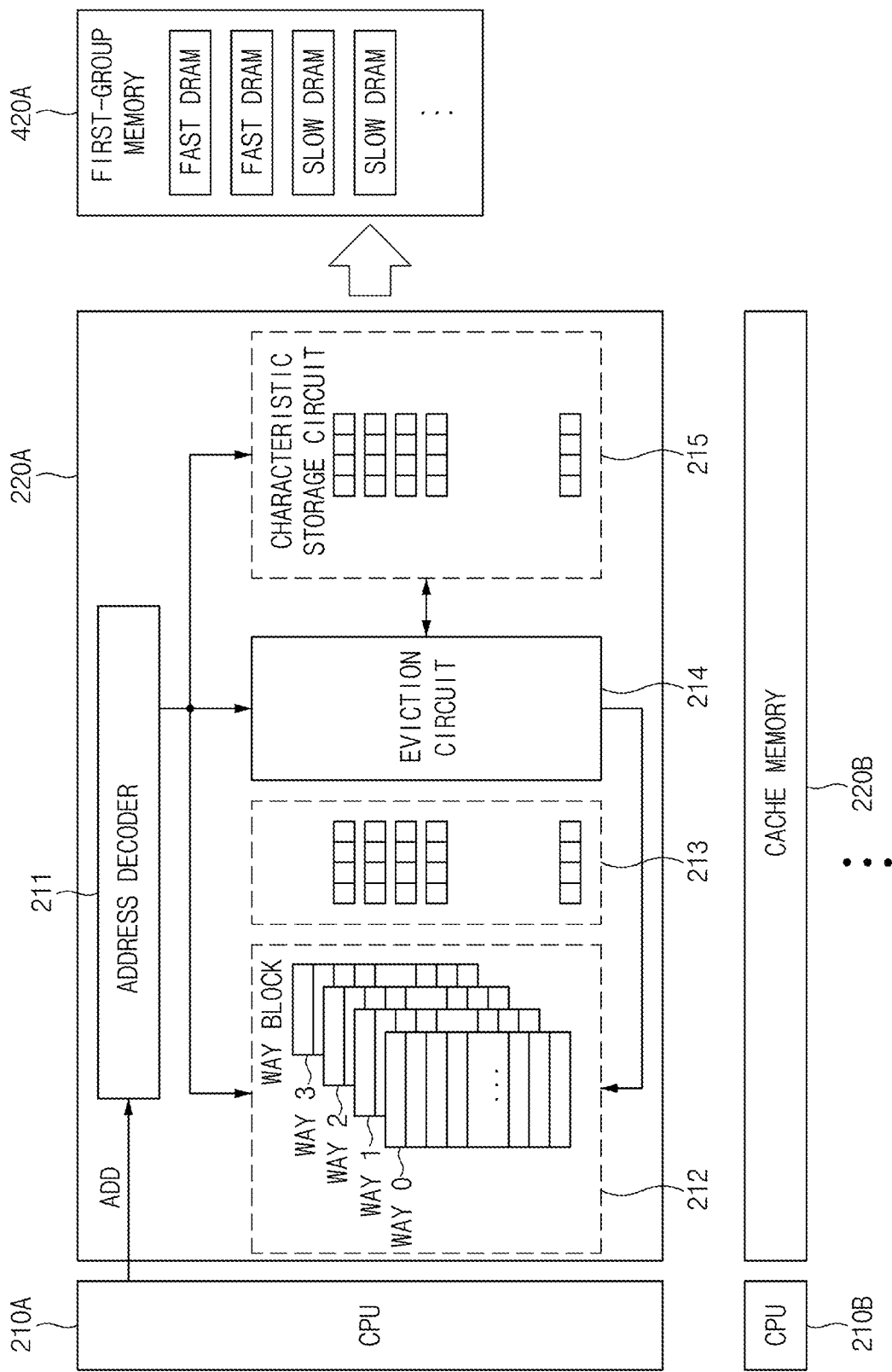
FIG. 6 is a schematic diagram illustrating an example of cache memories shown in FIG. 5 according to an embodiment of the present disclosure.

FIG. 6 is a schematic diagram illustrating the cache memories 220A and 220B shown in FIG. 5 according to an embodiment of the present disclosure. Since the cache memories 220A~220C in this example have the same structure, the following embodiment of the present disclosure will hereinafter be described with reference to detailed constituent elements of only one cache memory 220A from among the plurality of cache memories 220A~220C for convenience of description and better understanding of the present disclosure.

Referring to FIG. 6, the cache memory 220A may include an address decoder 211, a way block 212, a data processor 213, an eviction circuit 214, and a characteristic storage circuit 215.

In this case, the address decoder 211 may decode an address ADD received from the CPU 210A, such that the address decoder 211 may select the corresponding address of the way block 212, the eviction circuit 214, and the characteristic storage circuit 215. The way block 212 may include a plurality of ways WAY0~WAY3 to store data during the operation of CPU 210A.

In this case, each of ways WAY0~WAY3 may include a tag address, a dirty flag, and data. The address ADD requested from the CPU may be created by a combination of a set number and a tag address. Therefore, in order to determine whether a value about the address requested from the CPU 210A was stored in the cache memory 220A, the cache memory 220A may inquire about (or check) tag addresses of the plurality of ways WAY0~WAY3 contained in a set that is automatically decided by the requested address ADD. In an embodiment, a specific value (e.g., "0") may be allocated to the tag address, such that the tag address "0" may indicate an empty state of the corresponding way.

The dirty flag may indicate whether data stored in the cache memory 220A was stored in each of the memories 420. For example, the activated (or enabled) dirty flag may indicate that data stored in each of the ways WAY0~WAY3 has been updated and has not been stored in each of the memories 420. Therefore, if it is confirmed that a dirty flag of a way expelled from the cache memory 220A was activated (or enabled), the memories 420 can be updated using the activated data.

The data processor 213 may process data corresponding to a cache replacement policy. For example, the cache replacement policy may refer to an operation for replacing cache data using a Least Recently Used (LRU) operation or a First-In First-Out (FIFO) operation. In this case, the LRU operation may be a function for sequentially replacing the least recently used data to increase a hit ratio. The FIFO operation may be a function for replacing data in the same order it was input.

The cache memory 220A may be characterized in that, when a cache full state is present due to limited space, the existing data (i.e., legacy data) should be deleted to load new data. To this end, based on operations of the data processor 213 in the cache full state, the eviction circuit 214 may delete data having a low probability that it will be referenced or write back the same data in a main memory, and then may replace data of the corresponding space with new data. An eviction circuit 214 according to an embodiment may determine priority information of each memory that performs eviction operations based on characteristic information stored in the characteristic storage circuit 215.

The characteristic storage circuit 215 may store characteristic information about the first-group memories 420A, characteristic information about the second-group memories 420B, and characteristic information about the first-group memories 420C. For example, the characteristic storage circuit 215 may store data access speed information about the above-mentioned first-group memories 420A. Assuming that each memory of the first-group memories 420A may include four DRAMs, the characteristic storage circuit 215 may store data access speed information of each of the four DRAMs contained in the first-group memories 420A. Two memories from among the four memories contained in the first-group memories 420A may have fast characteristics (FF) corresponding to the fast operation speed, and the remaining two memories may have slow characteristics (SS) corresponding to the slow operation speed.

In this case, the characteristic storage circuit 215 may store data access speed information for each memory as 1-bit data. For example, if a memory has fast characteristics (FF), data "0" may be stored in the characteristic storage circuit 215. If the memory has slow characteristics, data "1" may be stored in the characteristic storage circuit 215. In other embodiments, characteristics may be stored using a larger number of bits to designate larger numbers of gradations in a performance scale.

In a conventional process of evicting (or removing) cache data using only the hit ratio of the data processor 213, a miss penalty is not considered at all. While using a hit ratio does account for misses to a limited extent, e.g. a miss is an inverse of a hit, the miss penalty for those misses manifests as a delay that depends on a number of factors including memory performance characteristics. Therefore, a data processing system according to an embodiment of the present disclosure may store characteristic information of the memories 420 through the characteristic storage circuit 215. The data processing system may evict (or remove) cache data in consideration of the stored characteristics of the memories 420.

Figure 7:
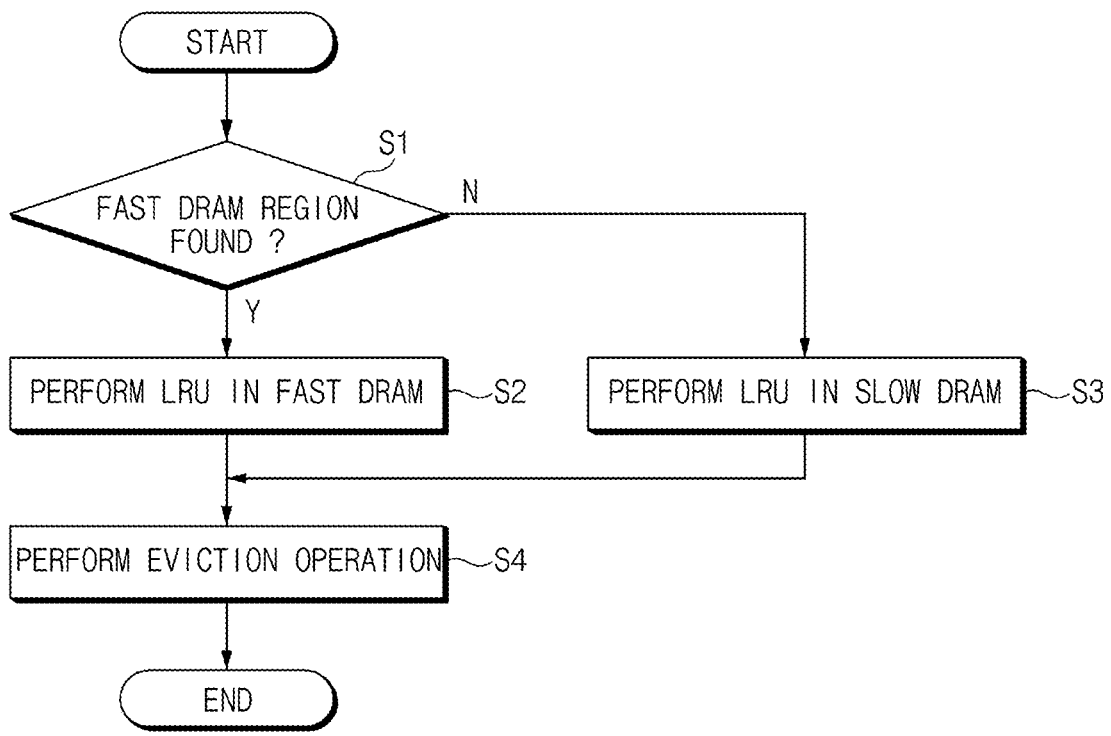
FIGS. 7 and 8 are flowcharts illustrating operations of an eviction circuit shown in FIG. 6 according to an embodiment of the present disclosure.
Figure 8:
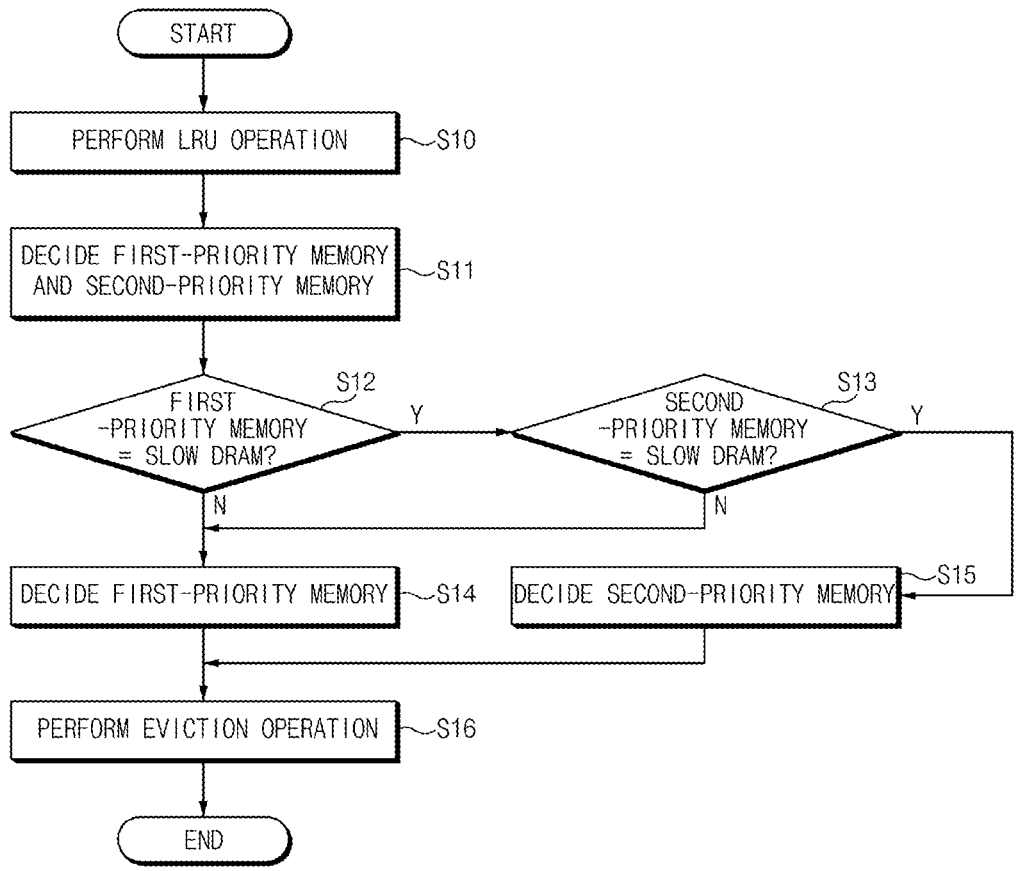

FIGS. 7 and 8 are flowcharts illustrating operations of the eviction circuit 214 shown in FIG. 6 according to an embodiment of the present disclosure. For convenience of description, the examples shown in FIGS. 7 and 8 illustrate an embodiment in which memories 420 are DRAMs. In addition, the examples of FIGS. 7 and 8 illustrate that the data processor 213 replaces cache data using the LRU operation.

As described above, the memories 420 may have different data access speeds according to either a relative position between the CPU 210A and the memories 420 or a temperature environment of the memories 420, such that the respective memories 420 may have different characteristics. In accordance with an embodiment, information about characteristics of the respective memories 420 may be stored in the characteristic storage circuit 215. The eviction circuit 214 may determine priority information of the respective memories, such that the eviction circuit 214 can perform eviction of the cache line according to not only the determined priority information, but also information stored in the characteristic storage circuit 215.

For example, a memory having fast characteristics (FF) may have a different miss penalty from a memory having slow characteristics (SS). For example, the FAST memory may have a lower miss penalty than the other SLOW memory.

In this case, the miss penalty may represent a time to be consumed to perform a line-fill operation caused by occurrence of a missed cache. In more detail, the line-fill operation may indicate that a cache memory accesses an external main memory due to occurrence of at least one missed cache, such that the corresponding line of the cache memory is filled with data stored in the main memory. Since an access time of the FAST memory is faster than an access time of the other SLOW memory, it is possible to reduce a miss penalty by using the FAST memory first to perform the eviction operation.

Accordingly, an eviction operation may first be performed in the FAST memory, such that data having a low miss penalty may be stored in the cache memory 220A.

FIG. 7 is a flowchart illustrating a process in which the eviction circuit 214 searches for a memory in which data eviction will be first carried out and an LRU operation is then performed in the corresponding memory.

Referring to FIG. 7, the eviction circuit 214 may determine the presence or absence of a FAST DRAM region in the cache memory based on characteristic information stored in the characteristic storage circuit 215 in step S1. If the FAST DRAM region is present in the cache memory in step S1, this FAST DRAM region may be determined to be an eviction block. The eviction circuit 214 may perform the LRU operation within the FAST DRAM region through the data processor 213 in step S2. The eviction circuit 214 may perform eviction of cache data according to the LRU operation in step S4. In contrast, if the FAST DRAM region is not present in the cache memory in step S1, i.e., a SLOW DRAM region is determined to exist in the cache memory in step S1, the SLOW DRAM region may be designated as an eviction block. The eviction circuit 214 may perform the LRU operation through the data processor 213 within the SLOW DRAM region in step S3. Thereafter, the eviction circuit 214 may perform eviction of cache data according to the LRU operation in step S4.

FIG. 8 is a flowchart illustrating that the LRU operation is first performed and a memory in which data eviction will be performed is searched for by the eviction circuit 214.

Referring to FIG. 8, the eviction circuit 214 may perform the LRU operation through the data processor 213 in step S10. Thereafter, the eviction circuit 214 may determine priority information for a memory in which data eviction will be carried out, based on characteristic information stored in the characteristic storage circuit 215 in step S11.

Thereafter, the eviction circuit 214 may determine whether a first-priority memory in which data eviction will be first carried out is a SLOW DRAM in step S12. If the first-priority memory is determined to be the SLOW DRAM in step S12, the eviction circuit 214 may determine whether a second-priority memory is a SLOW DRAM in step S13.

If the first-priority memory is not the SLOW DRAM in step S12, the eviction circuit 214 may determine a FAST DRAM to be the first-priority memory. In more detail, the eviction circuit 214 may compare miss penalty values of FAST DRAMs with each other, may determine one FAST DRAM having a lower miss penalty from among multiple FAST DRAMs to be the first-priority memory in step S14, and may perform eviction of at least one cache line within the determined first-priority memory in step S16.

Although the first-priority memory is the SLOW DRAM and the second-priority memory is not the SLOW DRAM, the priority order is changed such that the FAST DRAM may be determined to be the first-priority memory. Although the FAST DRAM is not the first-priority memory, the priority order of the FAST DRAM may be changed to the first-priority memory, such that the eviction operation can first be carried out in the FAST DRAM. That is, miss penalty values of FAST DRAMs may be compared with each other, any FAST DRAM having a lower miss penalty may be determined to be the first-priority memory in step S14, and eviction of the cache line may be carried out in the determined first-priority memory in step S16.

In contrast, when the first-priority memory and the second-priority memory are SLOW DRAMs, a FAST DRAM may be determined to be the second-priority memory instead of the SLOW DRAM determined to the second-priority memory. In other words, miss penalty values of FAST DRAMs may be compared with each other, such that any FAST DRAM having a lower miss penalty may be determined to be the second-priority memory in step S15, and eviction of the cache line may be carried in the determined second-priority memory in step S16.

As is apparent from the above description, the data processing system according to the embodiments of the present disclosure may determine an eviction block in consideration of memory characteristics during cache management, resulting in reduction in a miss penalty.

Figure 9:
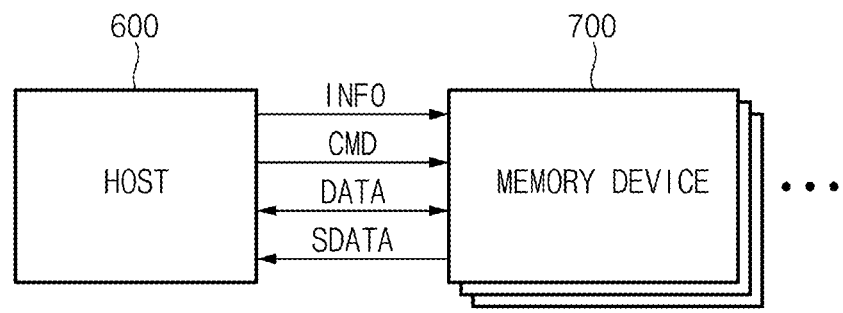
FIG. 9 is a block diagram illustrating a memory system according to an embodiment of the present disclosure.

FIG. 9 is a block diagram illustrating a memory system 11 according to an embodiment of the present disclosure.

The memory system 11 may include a host 600 and a plurality of memory devices 700. The host 600 may generate a control signal to control the memory devices 700. In accordance with one embodiment, the host 600 may generate memory information INFO, and may transmit the memory information INFO to the memory devices 700. The memory information INFO generated by the host 600 may include history information about a pattern used to access each of the memory devices 700. The memory information INFO generated by the host 600 may include memory region information. The memory region information may indicate how to classify all memories allocated to a process, and may indicate which one of usages is allocated to each of the classified memories. The host 600 may further include an interface (not shown) to interface with the memory devices 700.

The host 600 may generate a command signal CMD, and may transmit the command signal CMD to the memory devices 700. The command signal CMD may include one or more of a write command to write data in the memory devices 700, a read command to read stored data from the memory devices 700, and the like. In accordance with one embodiment, the host 100 may include a request command to request required data from among all the data stored in a page (to be described later) of each memory device 700.

The host 600 may transmit and receive data DATA to and from each of the memory devices 700. In other words, the host 600 may transmit data DATA to the memory devices 700 during a write operation, and may receive data DATA read from the memory devices 700 during a read operation. In an embodiment, the host 600 may receive subset data SDATA from among the data stored in a requested page (e.g., all the data stored in the requested page) of each memory device 700, as will be described subsequently.

In addition, the memory device 600 may provide data DATA in response to the command signal CMD received from the host 600. For example, the memory device 700 may store data received from the host 600 therein, or may read stored data and transmit the data that was read to the host 600.

The memory device 700 may receive memory information INFO from the host 600, may predict, based on the received memory information INFO, a data pattern for accesses to a subsequent page, and may generate subset data SDATA requested by the host 600 based on the received memory information INFO. Upon receiving from the host 600 the command signal CMD for reading data, the memory device 700 may transmit prepared subset data SDATA to the host 600.

The memory devices 700 according to the embodiment of the present disclosure may be a pooled memory system in which the same or different kinds of memories are provided in a unified form (or an integrated form). Any one selected from among the memory devices 700 may be accessed by a request of the host 600.

In addition, each of the memory devices 700 according to this embodiment may include a volatile memory, such as a Dynamic Random Access Memory (DRAM) or a Static Random Access Memory (SRAM). However, the scope or spirit of the present disclosure is not limited thereto, and each of the memory devices 700 may be implemented as any one of non-volatile memories, for example, a NAND flash memory, a NOR flash memory, a Phase-Change RAM (PRAM), a Ferroelectric RAM (FRAM), a Magnetic RAM (MRAM), etc., or may also be implemented as a combination thereof.

As described above, the memory system according to the embodiment may predict a data pattern of a page to be subsequently accessed in response to history information about a memory access pattern, and may generate subset data SDATA based on the predicted data pattern of the page. In addition, upon receiving a request from the host 600, the memory devices 700 may transmit the subset data SDATA to the host 600, instead of transmitting all the data of the page to the host 600. Therefore, the memory system according to the embodiment can greatly reduce a data transfer time and overhead as compared to a conventional memory system for transmitting data of all pages to a destination.

Figure 10:
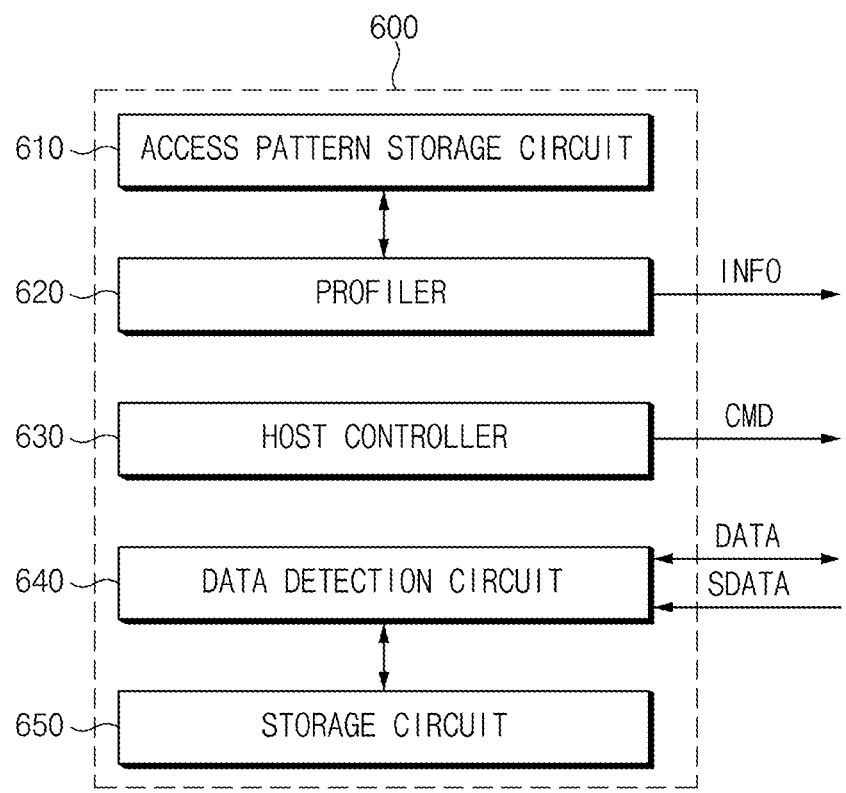
FIG. 10 is a block diagram illustrating a host according to an embodiment of the present disclosure.

FIG. 10 is a block diagram illustrating a host 600 according to an embodiment, such as the host 600 shown in FIG. 9.

The host 600 may include an access pattern storage circuit 610, a profiler 620, a host controller 630, a data detection circuit 640, and a storage circuit 650.

The access pattern storage circuit 610 may store history information of a memory access pattern of access to the memory devices 700 by the host 600.

The profiler 620 may include information about either a kernel level or an application level of memory regions of the memory devices 700, such that the profiler 620 may profile a memory access pattern based on the kernel level or application level information.

In addition, the profiler 620 may profile which pattern will be used by the host 600 accessing the memory devices 700. The profiler 620 may generate a profiled memory access pattern as memory information INFO, and may transmit the generated memory information INFO to the memory devices 700. The profiler 620 may generate information about a memory region accessed in the memory devices 700 as memory information INFO, and may transmit the memory information INFO to the memory devices 700.

The profiler 620 may analyze an inter-page access pattern or an intra-page access pattern, and may extract a memory access pattern based on the analyzed result.

For example, the profiler 620 may collect exception information that is generated after access protection for each page has been established, such that the profiler 620 may extract an inter-page access pattern based on the collected exception information. (That is, a protection mechanism (not shown) may be set to prohibit access to each page, so that an exception is generated when an attempt to access a previously un-accessed page is made. In response to the exception, access to the page is enabled, the access information is collected by the profiler 620, and the attempted access is then successfully completed.) In order to extract the inter-page access pattern, the profiler 620 may perform sampling of exception information for a specific time, and may then extract the inter-page access pattern using the sampling result. In addition, the profiler 620 may generate exception information about all pages, such that the profiler 620 may extract the intra-page access pattern based on the generated exception information. The page access pattern extracted from the profiler 620 may be stored in the access pattern storage circuit 610.

The host controller 630 may generate a command signal CMD for requesting subset data SDATA be accessed from among the data stored in each page of the memory devices 700. In other words, when a page requested by an application of the host 600 is present in the memory devices 700, the host controller 630 may generate a command signal CMD requesting that page, and may transmit the generated command signal CMD to the memory devices 700.

The data detection circuit 640 may receive the subset data SDATA requested from among the data stored in each page of the memory devices 700 (e.g., a subset of all the data in a page), and may detect data corresponding to a non-present cache line (that is, an absence of data for a memory region having an alignment and size corresponding to that of a cache line of the storage circuit 650) in the received subset data SDATA. In this case, when a present data region in the received subset data SDATA is accessed, the data detection circuit 640 may transmit the accessed subset data SDATA to the host controller 630.

The storage circuit 650 may store data DATA transmitted to or received from the data detection circuit 640. The storage circuit 650 may store subset data SDATA received through the data detection circuit 640.

Figure 11:
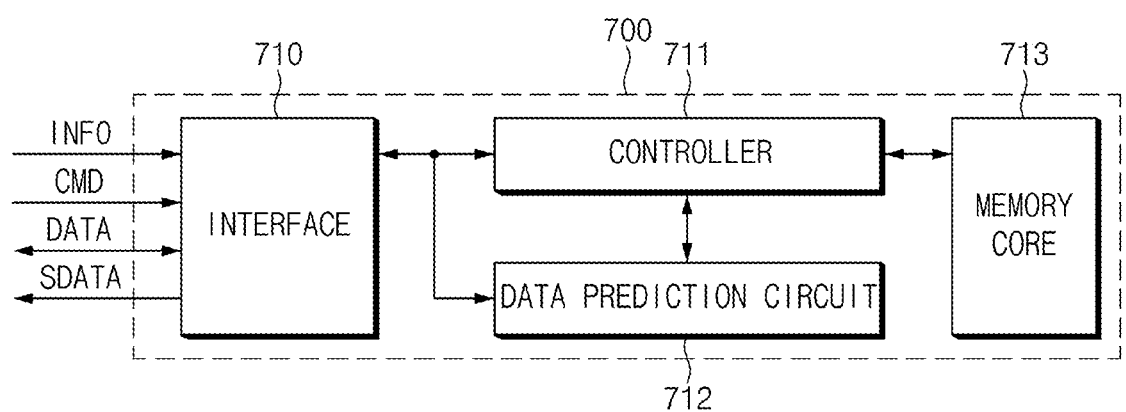
FIG. 11 is a block diagram illustrating a memory device according to an embodiment of the present disclosure.

FIG. 11 is a block diagram illustrating a memory device 700 according to an embodiment, such as each of the memory devices 700 shown in FIG. 9.

Each of the memory devices 700 may include an interface 710, a controller 711, a data prediction circuit 712, and a memory core 713.

The interface 710 may perform interfacing between the host 600 and the memory device 700. For example, the interface 710 may receive the memory information INFO and the command signal CMD from the host 600, and may transmit the memory information INFO and the command signal CMD to the controller 711 and the data prediction circuit 712. The interface 710 may receive data DATA and subset data SDATA from the controller 711 and the data prediction circuit 712, and may transmit the received data DATA and the received subset data SDATA to the host 600.

The controller 711 may analyze and process the command signal CMD received from the host 600. That is, upon receiving the command signal CMD from the host 600, the controller 711 may control operations of background functional blocks using firmware or software as needed to drive the memory core 713.

Upon receiving memory information INFO through the interface 710, the data prediction circuit 712 may predict, using profiled memory access pattern information, a data pattern of access to a subsequent page, and may generate subset data SDATA from the data within the subsequent page. The data prediction circuit 712 may extract data in consideration of a stride of the profiled memory access pattern information, and generate packetized subset data SDATA based on the extracted data. In this case, the term "stride" may refer to a distance between memory addresses. In another embodiment, the stride may refer to either a predicted stride or prediction of a memory address to be subsequently requested, and may be usefully used in prefetch.

The data prediction circuit 712 may predict a data pattern of access to a subsequent page through pattern learning. In this case, the term "pattern learning" may include a scheme for learning the existing address access history and searching for a pattern based on the learned result. For example, during pattern training, the data prediction circuit 712 may learn a necessary stride through a register (not shown) or may learn such a stride through machine learning, such that the data prediction circuit 712 may predict a data pattern of accesses to a subsequent page.

If the memory access pattern is considered unclear (or indefinite), the data prediction circuit 712 may prepare subset data SDATA by minimizing the number of false negatives. That is, when the memory access pattern is unclear (or indefinite) the data prediction circuit 712 may include additional data (beyond that clearly predicted by the memory access pattern) from each page in the generated subset data SDATA. In addition, when access regions are densely present in the page (that is, when a large fraction or threshold of the page is predicted to be accessed), the data prediction circuit 712 may transmit all the data of the page to the host 600. In an embodiment, the threshold of the page is 40 or greater, 50% or greater, 60% or greater, or 70% or greater, or 80% or greater, or 90% or greater. Upon receiving the command signal CMD through the interface 710, the data prediction circuit 712 may transmit the prepared subset data SDATA to the host 600 through the interface 710. When less than all the data of the page is transmitted to the host 600, the transmission of the prepared subset data SDATA to the host 600 may include an indication of the data pattern used to prepare the subset data SDATA. When all the data of the page is transmitted to the host 600, the transmission of the prepared subset data SDATA to the host 600 may include an indication of that all the data of the page is included in the subset data SDATA.

During the write operation, the memory core 713 may store data in a bank (not shown) under control of the controller 711. During the read operation, the memory core 713 may read stored data from the bank (not shown) under control of the controller 711.

Figure 12:
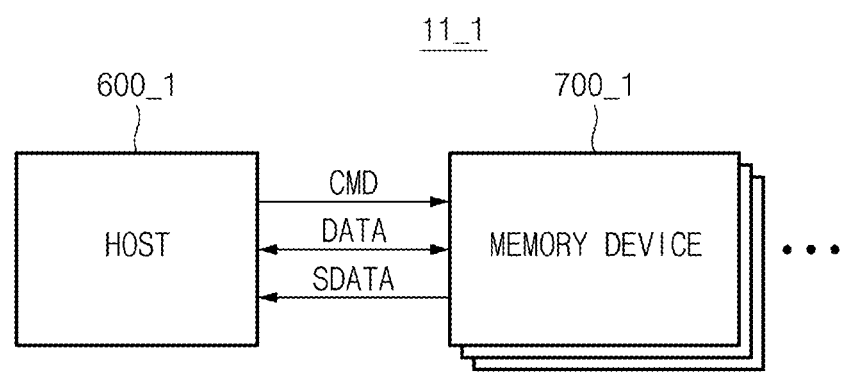
FIG. 12 is a block diagram illustrating a memory system according to another embodiment of the present disclosure.

FIG. 12 is a block diagram illustrating a memory system 11_1 according to another embodiment of the present disclosure.

The memory system 11_1 according to another embodiment of the present disclosure may include a host 600_1 and a plurality of memory devices 700_1.

The memory system 11_1 may allow an operation of profiling a memory access pattern to be processed in each of the memory devices 700_1 instead of the host 600_1. Therefore, unlike the host 600 of FIG. 9, the host 600_1 shown in FIG. 12 may not generate memory information INFO.

The remaining constituent elements and operations of the host 600_1 and the memory devices 700_1 are identical to those of FIG. 11, and as such a detailed description thereof will herein be omitted for convenience of description. In addition, the profile operation processed in the memory devices 700_1 will be described later.

Figure 13:
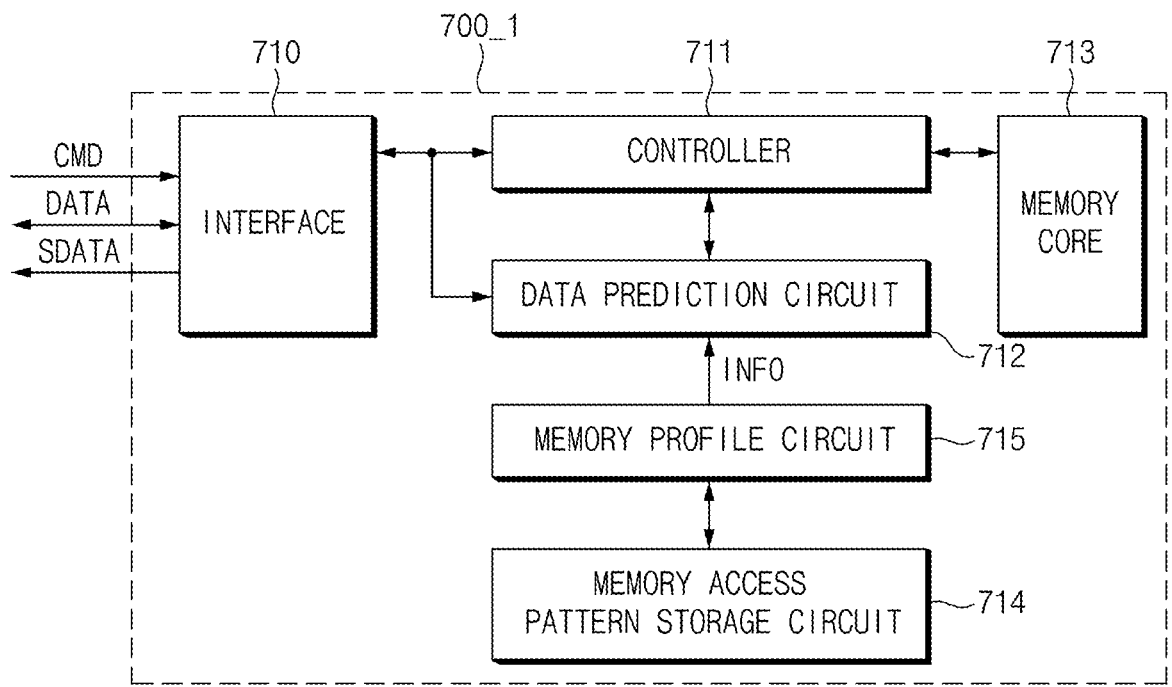
FIG. 13 is a block diagram illustrating a memory device according to another embodiment of the present disclosure.

FIG. 13 is a block diagram illustrating a memory device 700_1, such as one of the memory devices 700_1 shown in FIG. 12.

In addition to the interface 710, controller 711, data prediction circuit 712, and the memory core 713 of the memory device 700 of FIG. 11, the memory device 700_1 may further include a memory access pattern storage circuit 714 and a memory profile circuit 715.

The embodiment of FIG. 10 illustratively discloses that the host 600 includes the access pattern storage circuit 610 and the profiler 620 such that the profile operation of the memory access pattern is performed within the host 600. The embodiment of FIG. 13 discloses that the profile operation of the memory access pattern is performed in the memory devices 700_1. In another embodiment, the profile operation of the memory access pattern may be performed in the host and/or in the memory devices.

Referring back to FIG. 13, when the profile operation of the memory access pattern is performed in the memory devices 700_1, the controller 711 may receive a data request in units of a cache line from the host 600_1, without receiving a data request in units of a page from the host 600_1. In embodiments, a cache line may comprise, for example, 32, 64, 128, or 256 data bytes, but embodiments are not limited thereto.

The memory access pattern storage circuit 714 may store a memory access pattern in response to a stride occurring in a series of virtual addresses. That is, the application generating addresses in the host 600 may be generating virtual addresses. As a result, the memory access pattern storage circuit 714 may store a memory access pattern in response to virtual addresses received from the host 600. However, embodiments are not limited thereto.

A stride of a memory access pattern may be intermixed with other strides. However, along with memory region information received from the host 600, application information and the like may also be recorded in the memory access pattern storage circuit 714, so that the stride of the memory access pattern can be distinguished from other strides. The recorded information may indicate how the memory allocated to a process is divided, and the use (such as text, data, heap, or stack) intended for each division of the allocated memory. The application information may be used to distinguish between processes, that is, to distinguish memory accesses of one process from memory accesses of other processes.

The remaining constituent elements and operations of the memory device 700_1 shown in FIG. 13 are substantially identical to those of the memory devices 700 shown in FIG. 10, and as such a detailed description thereof will herein be omitted for convenience of description.

Figure 14:
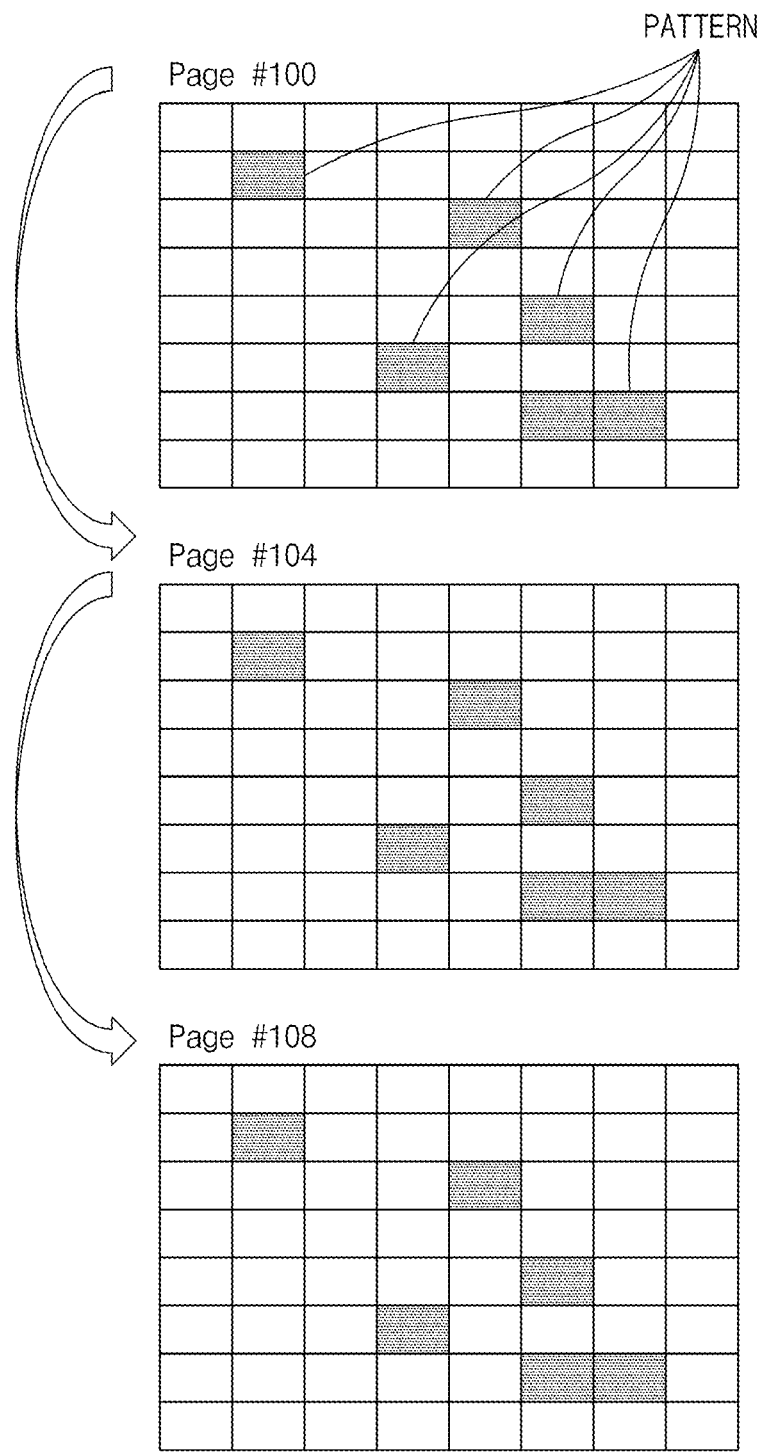
FIG. 14 illustrates a profile process of a host according to an embodiment of the present disclosure.

FIG. 14 illustrates a profile process of the host 600 shown in FIG. 10, such as may be performed by the profiler 620. Operations of FIG. 14 will hereinafter be described with reference to the embodiment of FIG. 10. However, in another embodiment, the operations similar to those described below may also be performed by the memory profile circuit 715 of FIG. 13 in the memory device 700_1 of FIG. 12.

The profiler 620 of the host 600 may read information stored in the access pattern storage circuit 610. The profiler 620 may profile history information of a previous memory access pattern, and may thus generate memory information INFO based on the profiled history information.

For example, the profiler 620 may profile pattern information of data accessed at page #100, pattern information of data accessed at page #104, and pattern information of data accessed at page #108. From the viewpoint of history information of the previous memory access pattern, it can be recognized that data requisite for the host 600 is some data of the page, but not all the data of the page.

If data accessed at page #100, data accessed at the page #104, and data accessed at page #108 are identical in location to each other, the host 600 may generate the corresponding access pattern as memory information INFO, and may transmit the generated memory information INFO to the memory devices 700. For example, if, as shown in FIG. 14, the host 600 access data within each of pages #100, #104, and #108 at offsets of 9, 20, 37, 43, 53, and 54, then in an embodiment the memory information INFO would indicate an access pattern including 9, 20, 37, 43, 53, and 54. In an embodiment, the memory pattern might apply only to pages having numbers equal to 100+4N, where N is an integer greater than or equal to 0.

Figure 15:
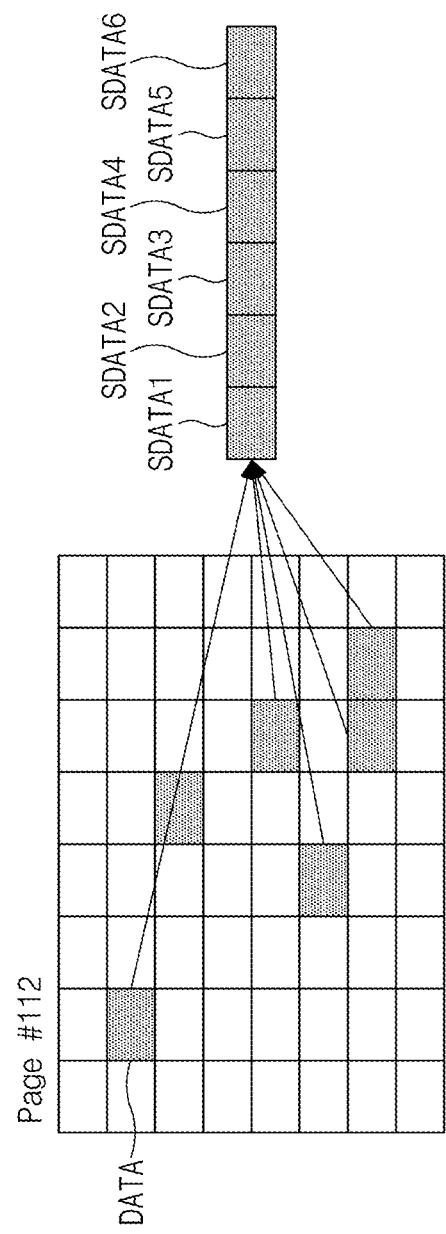
FIG. 15 is a conceptual diagram illustrating a data prediction process of the memory device shown in FIG. 11 according to an embodiment of the present disclosure.

FIG. 15 is a conceptual diagram illustrating a data prediction process of each memory device 700 shown in FIG. 11. Operations of FIG. 15 will hereinafter be described with reference to the embodiment of FIG. 11, however, embodiments are not limited thereto, and similar operations to those described below may occur in each memory device 700_1 of FIG. 13.

The data prediction circuit 712 of each of the memory devices 700 may predict a data pattern to be accessed at a subsequent page in response to memory information INFO received from the profiler 620.

For example, memory information INFO received from the profiler 620 may include specific information indicating that the memory access pattern at page #100, the memory access pattern at page #104, and the memory access pattern at page #108 are identical in location to each other. From that it is determined that the application of the host 600 tends to access the memory devices 700 using regular patterns. Accordingly, the data prediction circuit 712 may predict that data DATA corresponding to the same relative locations as were previously accessed in page #100, page #104, and page #108 will be accessed at a subsequent page #112.

The data prediction circuit 712 may generate subset data SDATA predicted to be required by the host 600 in response to a request for data DATA of the predicted page. The subset data SDATA generated by the data prediction circuit 712 may be transmitted to the host 600 through the interface 710. For example, when data about only one cache line is requested, the data prediction circuit 712 may transmit all the packets of the subset data SDATA to the host 600. In an embodiment, each packet of the transmitted subset data SDATA includes data having a size corresponding to a cache line from respective locations in the memory core 713 indicated by the memory information INFO.

If necessary, the data prediction circuit 712 may also adjust or control the amount of transmitted subset data SDATA in consideration of a reception speed of the command signal CMD generated by a data request from the host 600. For example, when the command signal CMD from the host 600 is received at low speed, the data prediction circuit 712 may reduce the amount of transmitted subset data SDATA. In an embodiment, the amount of transmitted subset data SDATA is reduced in order to complete the transmission of the subset data SDATA before a subsequent command signal CMD is received.

Meanwhile, the host 600 may recognize information about where the subset data SDATA is located in one or more pages of the memory devices 700. That is, when the controller 711 of each memory device 700 transmits the subset data SDATA to the host 600, the controller 711 may also transmit format information of the subset data SDATA.

For example, the controller 711 may include information about a distance to each subset data SDATA in the format information, and may transmit the resultant format information including the distance information to the host 600. A format of the distance information about the subset data SDATA may indicate how far the corresponding subset data SDATA is spaced apart from another subset data SDATA. That is, the format applied to the host 600 may include "Value of Subset Data SDATA" and "Information about Distance to Previous Subset Data SDATA".

For example, it is assumed that the number of subset data SDATA is set to 6 for convenience of description. Thus, the format of the subset data SDATA may be set to "{(9, SDATA1),(11,SDATA2),(17,SDATA3),(6,SDATA4),(10, SDATA5),(0,SDATA6)}". In each parenthesis of the above-mentioned {(9,SDATA1),(11,SDATA2),(17,SDATA3),(6, SDATA4),(10,SDATA5),(0,SDATA6)} format, a former number (9, 11, 17, 6, 10, 0) may indicate the distance to previous subset data SDATA, and a latter number (SDATA1~SDATA6) may indicate a value of subset data S DATA.

The controller 711 may transmit the above-mentioned data format to the host 600. Therefore, the host 600 may recognize location information of the subset data SDATA in each page of the memory devices 700.

Although the format of the subset data SDATA shown in FIG. 15 has been established as described above, the scope of the format of the subset data SDATA the present disclosure is not limited thereto.

Figure 16:
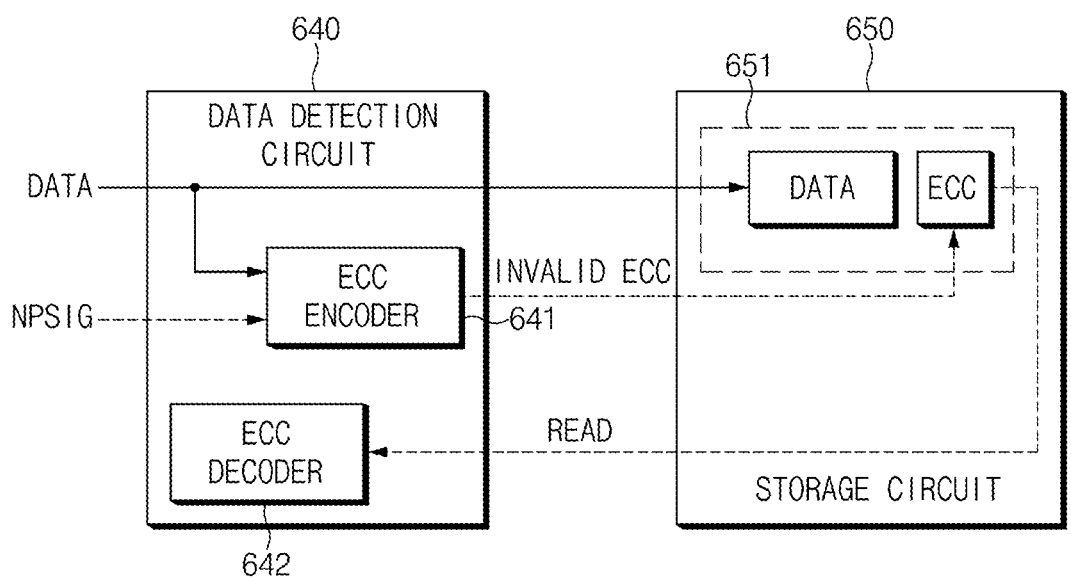
FIGS. 16 and 17 illustrate operations of a data detection circuit according to an embodiment of the present disclosure.
Figure 17:
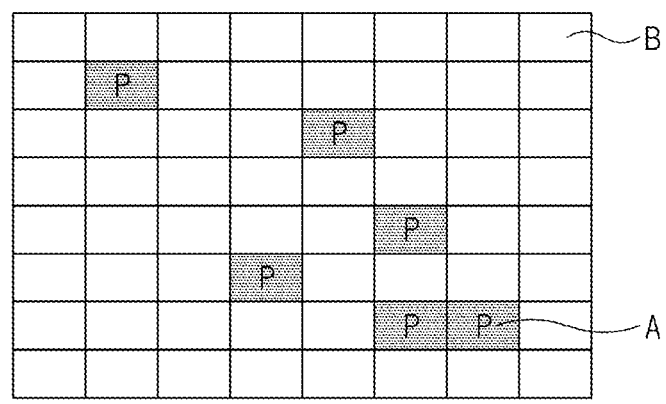

FIGS. 16 and 17 illustrate operations of a data detection circuit 640, such as the data detection circuit 640 shown in FIG. 10, according to an embodiment.

The data detection circuit 640 may include an Error Correction Code (ECC) encoder 641 and an ECC decoder 642. The storage circuit 650 may store not only data DATA but also an ECC received from the ECC encoder 641 in a cache line 651. The ECC can be an invalid ECC, that is, an ECC that is not equal to the calculated result of the ECC algorithm as applied to the data DATA.

A method for storing the subset data SDATA in the storage circuit 650 using the data detection circuit 640 will hereinafter be described in detail.

The host 600 may allocate an empty page to the storage circuit 650 so as to write data received from the memory devices 700. The data detection circuit 640 may allocate invalid data to all data fields of the corresponding page of the storage circuit 650.

The data detection circuit 640 may receive the subset data (SDATA) format from the memory devices 700 through the controller 711. The data detection circuit 640 may analyze the received data format, and may discriminate between "Value of Subset Data SDATA" and "Distance to Previous Subset Data SDATA". The data detection circuit 640 may store the subset data SDATA in the allocated location of the storage circuit 650 by referring to the distance information about each subset data SDATA.

Meanwhile, a method for determining a non-present region from among the pages of the storage circuit 650 using the data detection circuit 640 will hereinafter be described with reference to the attached drawings.

For convenience of description and better understanding of the present disclosure, it is assumed that the host 600 performs the write operation of data from a specific address in units of a cache line 651 in the storage circuit 650, that is, if the cache line 651 can store N bytes of data, the host 600 performs the write operations in blocks of N bytes. The cache line 651 may be one of a plurality of cache lines in the storage circuit 650, each cache line including data storage, address tag storage, and storage for an Error Correction Code (ECC). Upon receiving a non-present detection signal NPSIG, the ECC encoder 641 may encode the data to generate an invalid error correction code (ECC), and may store the generated invalid ECC in a cache line 651 to mark the cache line 651 as not including valid data. In other words, the data detection circuit 640 may intentionally generate an invalid ECC through the ECC encoder 641, and may output the invalid ECC to the storage circuit 650 to indicate that the cache line does not presently store valid data.

During the read operation, the invalid ECC stored in the cache line 651 may be transmitted to the ECC decoder 642. The ECC decoder 642 may decode the ECC read from the corresponding cache line 651. The data detection circuit 640 may determine whether valid data is present in the cache line 651 according to the result produced by the ECC decoder 642.

The data detection circuit 640 may also detect the presence or absence of errors based on the decode result of the ECC decoder 642. If the decode result indicates an error but is not identical to the intentional invalid ECC, the data detection circuit 640 may determine that the detected error is an actual fault, that is, that the data and/or the ECC values read from the cache line 651 is not the same as the data and/or ECC values that were stored in the cache line 651. That is, the data detection circuit 640 may determine whether the intentional invalid ECC previously stored into the cache line 651 has been detected or whether an actual fault has been default. The ECC encoder 641 may receive a non-present detection signal NPSIG as an input, and may thus encode the ECC using the received non-present detection signal NPSIG. Therefore, if the non-present detection signal NPSIG is activated (or enabled), the data detection circuit 640 may determine that an error has occurred in the intentional invalid ECC.

For example, the ECC encoder 641 may receive data DATA and an ECC corresponding to the data DATA. If a predetermined ECC bit corresponding to the corresponding data DATA is set to "0", the ECC encoder 641 may encode an invalid ECC by changing the predetermined ECC bit set to "0" into "1", and may store the encoded result in the cache line 651. Subsequently, the data detection circuit 640 may decode the ECC stored in the cache line 651, and may compare the decoded ECC with an original ECC bit. In an embodiment, the original ECC bit is generated by ECC encoding the data stored in the cache line 651.

If an ECC bit decoded by the ECC decoder 642 is set to "0", when the original ECC bit was also set to "0", this means that data has already been stored in the cache line 651 such that the region corresponding to the ECC bit "0" is considered to be a present region. In contrast, if an ECC bit decoded by the ECC decoder 642 is set to "1", when the original ECC bit was also set to "0", this means that data has not been stored in the cache line 651 such that the region corresponding to the ECC bit "1" is considered to be a non-present region. That is, when an ECC value stored in a cache line differs from an ECC value generated by ECC encoding the data stored in the cache line in a predetermined way, this is interpreted as meaning that valid data has not been stored in the cache line 651 and the corresponding region is considered to be a non-present region.

Referring to FIG. 17, the data detection circuit 640 may display information about whether data is stored in the cache line 651 using a bitmap. For example, if an ECC error has occurred, this means that the corresponding region is a non-present region in which no data is stored, such that each of the non-present regions is denoted by B (that is, a bit value represented by a blank) of FIG. 17. Here, "B" may denote invalid data. In contrast, if no ECC error has occurred, this means that the corresponding region is a present region in which data is stored, such that each of the present regions is denoted by A (that is, a bit value represented by the character "P") of FIG. 17.

In an embodiment, the data detection circuit 640 may have a specific rule to discriminate between an intended ECC error and an actual memory error. For example, in an embodiment the specific rule may be denoted by "+1". In the case of using the specific rule "+1", when a correct ECC encoding of data is "C", an ECC value of "C+1" may be generated to indicate the non-present data. Thereafter, if the complementary rule "−1" is applied to ECC check processing, it can be confirmed that the corresponding region is a non-present region and not an ECC error resulting from a fault or corruption of the memory store. That is, if the rule "+1" is used to generate ECC indicating a non-present regions, then when an ECC check of a cache line generates a value equal to the stored ECC value thereof, the data detection circuit 640 determines that data is present and correct in the cache line, when the ECC check generates a value equal to the stored ECC value minus 1, the data detection circuit 640 determines that the non-present region is indicated for the cache line, and when the ECC check generates a value equal to any other value, the data detection circuit 640 determines that an error occurred in reading the cache line.

That is, since the host 600 is designed to access the memory devices 700 in units of a page, the host 600 may have difficulty in accessing regions contained in each page. Accordingly, from the viewpoint of the host 600, the host 600 may have difficulty in deciding the presence or absence (for example, in the storage circuit 650) of a non-present region in each page of the memory devices 700. Thus, the memory system according to the embodiments of the present disclosure may detect non-present data in the host 600 through the data detection circuit 640.

As is apparent from the above description, the memory system according to the embodiments of the present disclosure may increase a data transfer rate by reducing overhead.

Figure 18:
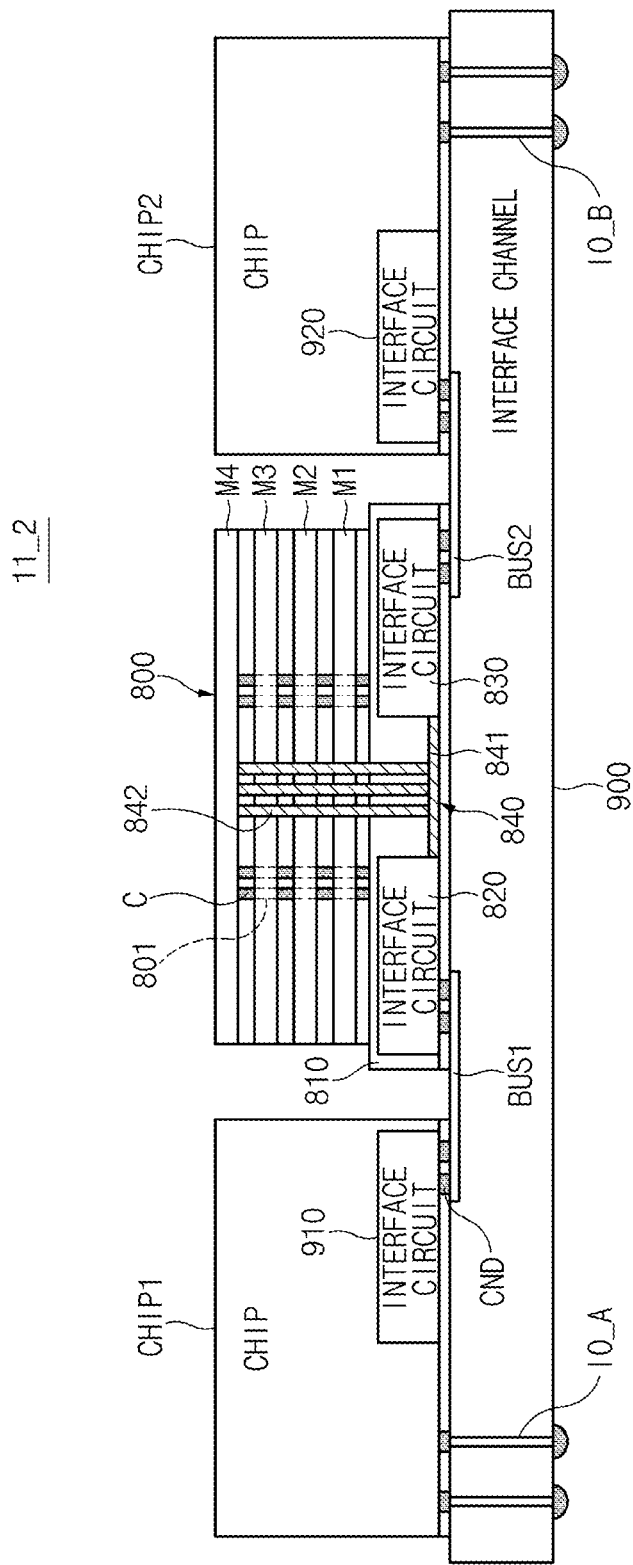
FIG. 18 illustrates a memory system according to an embodiment of the present disclosure.

FIG. 18 illustrates a memory system 11_2 according to an embodiment of the present disclosure.

Referring to FIG. 18, the memory system 11_2 may include a stacked memory (or a stacked memory device) 800, a plurality of chips (e.g., first and second chips CHIP1 and CHIP2), and an interface channel 900.

In this case, the stacked memory 800 may be disposed between the first chip CHIP1 and the second chip CHIP2, and may be shared by the first and second chips CHIP1 and CHIP2. Specifically, two chips (e.g., first chip CHIP1 and second chip CHIP2) may be combined to share a single stacked memory 800. In other embodiments, more than two chips (e.g., 3, 4 or more chips) may be combined to share the stacked memory 800.

The stacked memory 800 may be implemented as a packaged memory device in which a plurality of memories M1~M4 are stacked such that the plurality of memories M1~M4 may be integrated in a single memory device. Each of the memories M1~M4 may be selected from various memory device types, for example, Dynamic Random Access Memory (DRAM), Phase-Change Random Access Memory (PCRAM), Resistive Random Access Memory (ReRAM), flash memory, etc. In an embodiment, the memories M1~M4 comprise of the same memory types. In another embodiment, the memories M1~M4 do not comprise of the same memory types.

The memories M1~M4 may be coupled through at least one contact C. The memories M1~M4 may be electrically coupled through one or more Through Silicon Vias (TSVs) 801. The contacts C serve as contacts for corresponding TSVs 801.

In an embodiment, the TSVs 801 may be used to transmit a power-supply voltage to each of the memories M1~M4. For convenience of description and better understanding of the present disclosure, four memories M1~M4 may be stacked in the stacked memory 800 according to the embodiment shown in FIG. 18 of the present disclosure. However, embodiments of the present disclosure are not limited thereto, and the number of memories contained in the stacked memory 800 may vary.

The stacked memory 800 may be implemented as a High Bandwidth Memory (HBM) in which the memories M1~M4 are electrically coupled through the TSVs 801 so as to increase the number of input/output (I/O) units, resulting in an increased bandwidth.

The high bandwidth memory (HBM) may be a memory configured to have a higher bandwidth and higher density as compared to a conventional memory. For example, a plurality of memory chips may be stacked in the high bandwidth memory (HBM) using three-dimensional Through Silicon Via (3D-TSV) technology, and the high bandwidth memory (HBM) may include a large number of data pins to increase an input/output (I/O) bandwidth. The high bandwidth memory (HBM) may normally operate using the stacked memory chips and the large number of data pins.

A buffer layer 810 may be disposed between the plurality of memories M1~M4 and the interface channel 900. In an embodiment, the buffer layer 810 is provided below the memories M1~M4. The buffer layer 810 may include a shared bus 840 and interface circuits 820 and 830. In an embodiment, the buffer layer 810 may function as an interposer to electrically couple the memories M1~M4 to first and second buses BUS1 and BUS2 of an interface channel 900.

The interface circuit 820 of the buffer layer 810 may be coupled to the first bus BUS1 of the interface channel 900 through one or more contact nodes CND. Because the first bus BUS1 is electrically coupled to the first chip CHIP1, the interface circuit 820 may be electrically coupled to the first chip CHIP1 through the first bus BUS1. The interface circuit 830 of the buffer layer 810 may be coupled to the second bus BUS2 of the interface channel 900 through one or more contact nodes CND. Because the second bus BUS2 is electrically coupled to the second chip CHIP2, the interface circuit 830 may be electrically coupled to the second chip CHIP2 through the second bus BUS2.

In an embodiment, the interface circuit 820 of the buffer layer 810 may include a physical layer (PHY) for electrically coupling the stacked memory 800 to the first chip CHIP1 such that the stacked memory 800 may exchange signals with the first chip CHIP1 through the interface circuit 820. The interface circuit 830 of the buffer layer 810 may include a physical layer (PHY) for electrically coupling the stacked memory 800 to the second chip CHIP2, such that the stacked memory 800 may exchange signals with the second chip CHIP2 through the interface circuit 830.

The shared bus 840 may be coupled between the interface circuits 820 and 830 and the memories M1~M4. The shared bus 840 may transmit signals that have been received through the interface circuits 820 and 830 to the memories M1~M4. The shared bus 840 may transmit signals that have been received from the memories M1~M4 to the first and second chips CHIP1 and CHIP2 through the interface circuits 820 and 830, respectively. In an embodiment, the shared bus 840 may be used to transmit at least one signal to each of the memories M1~M4.

The shared bus 840 may include a horizontal bus 841 disposed between the two interface circuits 820 and 830, and a vertical bus 842 including a plurality of lines each extending in a first direction substantially perpendicular to the horizontal bus 841. The horizontal bus 841 may be shared by two interface circuits 820 and 830.

For electrical coupling between the two interface circuits 820 and 830, the horizontal bus 841 may include a line extending in a second direction (e.g., a horizontal direction in FIG. 18) that crosses the first direction. For example, the second direction may be substantially perpendicular to the first direction and substantially parallel to a top surface of the interface channel 900. For electrical coupling between the horizontal bus 841 and each of the memories M1~M4, the vertical bus 842 may include the plurality of lines each extending in the first direction (e.g., a vertical direction in FIG. 18). In the embodiment shown in FIG. 18, the shared bus 840 may have an inverted T-shape resulting from the shapes of the horizontal bus 841 and the vertical bus 842.

In an embodiment, the vertical bus 842 may include the plurality of lines each having an integrated line shape. For example, each of the plurality of lines of the vertical buses 842 may be a single body and have a line shape, such that each of the plurality of lines is coupled to a bottom surface of the uppermost memory M4 and passes through the remaining memories M1~M3. The plurality of lines of the vertical bus 842 (e.g., three vertical lines in FIG. 18) may be arranged substantially parallel to each other and be disposed in a center region of the stacked memory 800.

Although the shared bus 840 according to the above-described embodiment includes the plurality of lines of the vertical bus 842 each having the integrated line shape for convenience of description and better understanding of the present disclosure, embodiments of the present disclosure are not limited thereto. In another embodiment, each of the plurality of lines of the vertical bus 842 may include one or more of TSVs (not shown) respectively formed through one or more of the memories M1~M4 and one or more contacts (not shown) each coupling adjacent TSVs.

The first chip CHIP1 may exchange signals with the stacked memory 800 through the first bus BUS1. In the embodiment shown in FIG. 18, the first chip CHIP1 may be implemented as a processor such as a Central Processing Unit (CPU).

The first chip CHIP1 according to the above-described embodiment is implemented as a CPU for convenience of description and better understanding of the present disclosure. However, embodiments of the present disclosure are not limited thereto.

In addition, the first chip CHIP1 may include an interface circuit 910 to exchange signals with the stacked memory 800. The interface circuit 910 may be coupled to the first bus BUS1 through one or more contact nodes CND. The first bus BUS1 is coupled to the interface circuit 820 of the stacked memory 800, and thus the interface circuit 910 of the first chip CHIP1 may be electrically coupled to the interface circuit 820 of the stacked memory 800 through the bus BUS1.

The interface circuit 910 of the first chip CHIP1 may include a circuit structure (for example, a physical layer PHY) to perform memory interfacing between the first chip CHIP1 and the stacked memory 800.

The second chip CHIP2 may exchange signals with the stacked memory 800 through the second bus BUS2. In an embodiment, the second chip CHIP2 may be implemented as a System on Chip (SoC). In the embodiment shown in FIG. 18, the second chip CHIP2 may be implemented as a processor, for example, a Graphics Processing Unit (GPU) or an accelerator.

The second chip CHIP2 according to the above-described embodiment is implemented as a GPU or accelerator for convenience of description and better understanding of the present disclosure. However, embodiments of the present disclosure are not limited thereto, e.g., the second chip CHIP2 may a CPU or the same type of chip as the first chip CHIP1.

The second chip CHIP2 may include an interface circuit 920 to exchange signals with the stacked memory 800. The interface circuit 920 of the second chip CHIP2 may be coupled to the second bus BUS2 through one or more contact nodes CND. The second bus BUS2 is coupled to the interface circuit 830 of the stacked memory 800, and thus the interface circuit 920 of the second chip CHIP2 may be electrically coupled to the interface circuit 830 of the stacked memory 800 through the second bus BUS2.

The interface circuit 920 of the second chip CHIP2 may include a circuit structure (for example, a physical layer PHY) to perform memory interfacing between the second chip CHIP2 and the stacked memory 800.

The interface channel 900 may be disposed below the first and second chips CHIP1 and CHIP2 and the stacked memory 800. The interface channel 900 may be an interposer channel to exchange signals between the stacked memory 800 and the chips CHIP1 and CHIP2.

The interface channel 900 may include of the first and second buses BUS1 and BUS2 and first and second input/output (I/O) buses IO_A and IO_B. The first bus BUS1 may couple the interface circuit 910 of the first chip CHIP1 and the interface circuit 820 of the stacked memory 800 through corresponding contact nodes CND. The second bus BUS2 may couple the interface circuit 920 of the second chip CHIP2 and the interface circuit 830 of the stacked memory 800 through corresponding contact nodes CND. In an embodiment, each of the first and second buses BUS1 and BUS2 may be an interposer channel through which a corresponding pair of the interface circuits 910, 820, 830 and 920 are electrically coupled to each another.

The first I/O bus IO_A may be a bus through which the first chip CHIP1 is coupled to an external device (e.g., an external chip). The second I/O bus IO_B may be a bus through which the second chip CHIP2 is coupled to an external device (e.g., an external chip).

In a conventional memory system where a plurality of memories are coupled to a plurality of chips on a one to one basis, it is necessary for each of the plurality of chips to include an additional memory for data transmission therefrom. In this case, since the conventional memory system does not include a channel through which the respective memories are coupled to each other during data transmission of each memory, the conventional memory system must allow data of each memory to pass through different chips every data transmission, resulting in reduction in data transmission efficiency.

For example, in a conventional memory system, a plurality of memories are coupled to a plurality of chips, respectively, and two or more chips are coupled to each other through I/O buses. When data is transmitted from a first memory to a second memory, because the first memory and the second memory is not directly coupled through a channel, the data is transmitted from the first memory to a first chip coupled to the first memory, transmitted from the first chip to a second chip coupled to the second memory through one or more I/O buses, and then transmitted from the second chip to the second memory.

In contrast, according to an embodiment of the present disclosure, multiple chips (e.g., the first and second chips CHIP1 and CHIP2 in FIG. 18) are configured to share the stacked memory 800 through the shared bus 840 of the stacked memory 800, and thus the multiple chips may share data stored in the stacked memory 800. In addition, the shared bus 840 may directly transmit data between the first chip CHIP1 and the second chip CHIP2 without accessing the stacked memory 800. As a result, data transmission efficiency may be increased and power consumption caused by such data transmission may be reduced.

Figure 19:
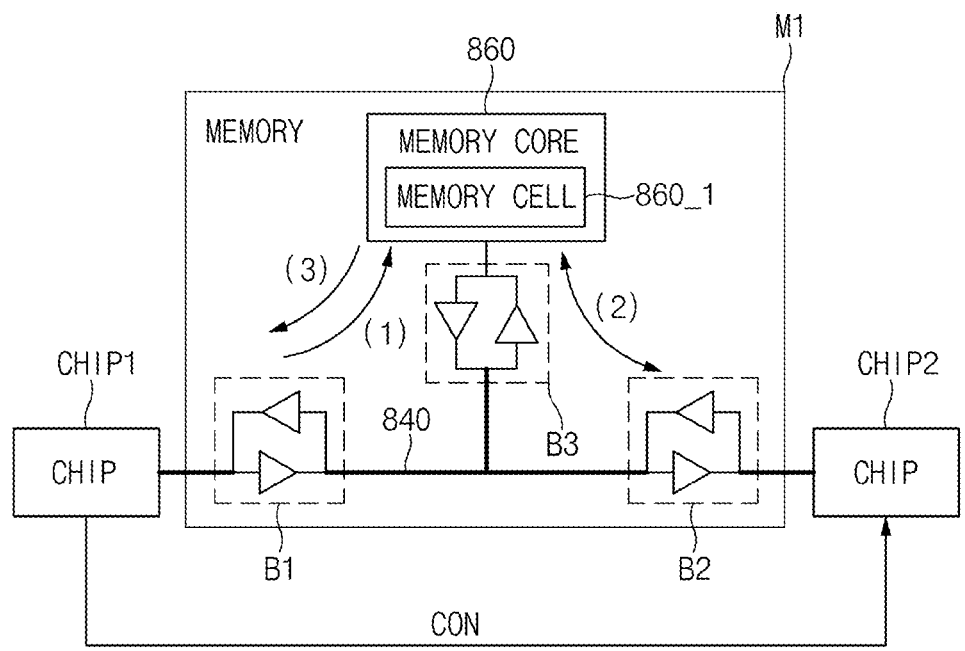
FIG. 19 illustrates a memory (or a memory device) shown in FIG. 1 according to an embodiment of the present disclosure.

FIG. 19 illustrates a memory M1 shown in FIG. 18 according to an embodiment of the present disclosure. Since the memories M1~M4 according to an embodiment of the present disclosure are substantially identical in structure to each other, a detailed structure of the memory M1 from among the memories M1~M4 will be described below for convenience of description and better understanding of the present disclosure, and descriptions for the remaining memories M2~M4 will be omitted for the interest of brevity. In addition, some of constituent elements of the memory M1 that are used for data transmission will hereinafter be described with reference to FIG. 19.

The memory M1 may include a shared bus 840, first, second, and third buffers B1, B2, and B3, and a memory core 860.

The first buffer B1 may buffer at least one signal received from a first chip CHIP1, and may transmit the buffered signal to the shared bus 840. In addition, the first buffer B1 may buffer at least one signal received from the shared bus 840, and may transmit the buffered signal to the first chip CHIP1.

The second buffer B2 may buffer at least one signal received from the second chip CHIP2, and may transmit the buffered signal to the shared bus 840. In addition, the second buffer B2 may buffer at least one signal received from the shared bus 840, and may transmit the buffered signal to the second chip CHIP2.

The third buffer B3 may buffer at least one signal applied to the shared bus 840, and may transmit the buffered signal to the memory core 860. In addition, the buffer B3 may buffer at least one signal received from the memory core 860, and may transmit the buffered signal to the shared bus 840.

In an embodiment, the first and second chips CHIP1 and CHIP2 may perform data communication with each other through the shared bus 840 without passing through the memory core 860. In an embodiment, addresses, commands, and control signals may also be communicated between the first chip CHIP1 and the second chip CHIP2 through the shared bus 840.

The memory core 860 may include not only a plurality of memory cells 860_1, each of which stores data therein, but also a plurality of circuits for performing one or more core operations of the memory cells 860_1.

In an embodiment, when a single stacked memory 800 is shared by the first and second chips CHIP1 and CHIP2, a time (or an access time) at which the first chip CHIP1 or the second CHIP starts to access the single stacked memory 800 may be controlled. For convenience of description and better understanding of the present disclosure, in the embodiment of FIG. 19, one chip (e.g., the first chip CHIP1) may have higher priority over the other chip (e.g., the second chip CHIP2), and the higher-priority chip CHIP1 may control an access time to the shared bus 840. In accordance with the embodiment shown in FIG. 19 of the present disclosure, the first chip CHIP1 may generate a control signal CON, and may transmit the generated control signal CON to the second chip CHIP2, thereby controlling an access time to the stacked memory 800.

For example, when the first chip CHIP1 gains access to the memory core 860, the first chip CHIP1 may transmit an activated (or enabled) control signal CON to the second chip CHIP2. The second chip CHIP2 may enter a standby mode in response to the activated control signal CON. After the first chip CHIP1 has completed an operation of accessing the memory core 860, the first chip CHIP1 may transmit a deactivated (or disabled) control signal CON to the second chip CHIP2. As a result, the second chip CHIP2 may perform an operation of accessing the memory core 860.

In an embodiment, the single stacked memory 800 is shared by the first chip CHIP1, the second chip CHIP2, and a third chip (not shown). The first chip CHIP1 may have higher priority over the second chip CHIP2, and the second chip CHIP2 may have higher priority over the third chip. For example, when the first chip CHIP1 accesses the memory core 860, the first chip CHIP1 may transmit an activated (or enabled) first control signal (not shown) to the second chip CHIP2 and the third chip. As a result, each of the second chip CHIP2 and the third chip may enter a standby mode in response to the activated first control signal. After the first chip CHIP1 has completed an operation of accessing the memory core 860, the first chip CHIP1 may transmit a deactivated (or disabled) first control signal to the second chip CHIP2 and third chip. When the second chip CHIP2 receives the deactivated first control signal from the first chip CHIP1, the second chip CHIP2 may access the memory core 860 and transmit an activated second control signal (not shown) to the third chip. As a result, the third chip may enter a standby mode in response to the activated second control signal. When the third chip receives the deactivated first control signal and a deactivated second control signal, the third chip may access the memory core 860.

Operations of the memory M1 shown in FIG. 19 are as follows.

First of all, upon receiving a command (e.g., a command for processing data written in an arbitrary address, and a processing type about the written data, etc.) from a host (not shown), the first chip CHIP1 may access the memory M1. The first buffer B1 may buffer data received from the first chip CHIP1, and the buffered data may be transmitted to the shared bus 840. The third buffer B3 may buffer data received through the shared bus 840, and the buffered data may be stored in a specific region (e.g., a common region 863 in FIG. 22) of the memory cell 860_1 after passing through a first route (1).

Thereafter, the second chip CHIP2 may read data (e.g., data written by the first chip CHIP1) stored in a specific region (e.g., the common region 863 in FIG. 22) of the memory cell 860_1, and may perform a computation operation on the read data. The second chip CHIP2 may store data in the memory core 860 during a write operation, and may read data stored in the memory core 860 during a read operation.

For example, data read from the memory cell 860_1 may be buffered by third and second buffers B3 and B2, the buffered data may be transmitted to the second chip CHIP2, and then processed by the second chip CHIP2. Data processed by the second chip CHIP2 may be buffered by the second buffer B2, and the buffered data may be transmitted to the shared bus 840. The third buffer B3 may buffer the transmitted data to the shared bus 840, and the buffered data may be stored in a specific region (e.g., a second chip allocation region 862 in FIG. 22) of the memory cell 861 through a second route (2).

Subsequently, the first chip CHIP1 may read data stored in a specific region (e.g., the second chip allocation region 862 in FIG. 22) of the memory cell 860_1 through a third route (3), may confirm the data processing result of the second chip CHIP2 based on the read data, and may perform other operations based on the confirmed result.

As described above, in a memory system (e.g., the memory system 11_2 in FIG. 18) according to an embodiment of the present disclosure, data communicated between the plurality of chips CHIP1 and CHIP2 may be processed within a stacked memory device (e.g., the stacked memory 800), resulting in increased efficiency in data transmission.

Figure 20:
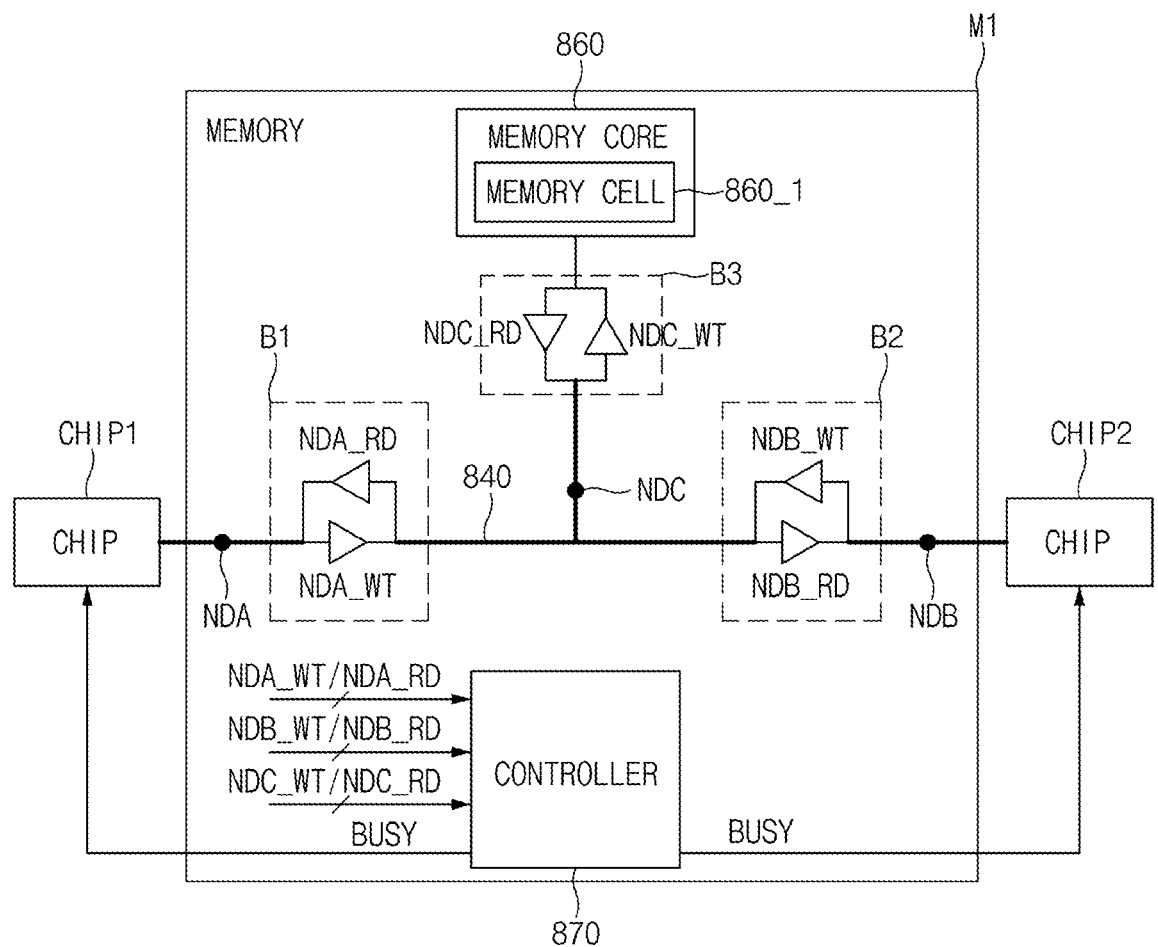
FIG. 20 illustrates a memory (or a memory device) shown in FIG. 18 according to an embodiment of the present disclosure.

FIG. 20 illustrates the memory M1 shown in FIG. 18 according to an embodiment of the present disclosure. The memory M1 shown in FIG. 20 may further include a controller 870 as compared to the memory M1 shown in FIG. 19.

Referring to FIG. 20, the controller 870 may adjust or control an access time at which either a first chip CHIP1 or a second chip CHIP2 starts to access the memory core 860. In other words, when a single stacked memory 800 is shared by the first and second chips CHIP1 and CHIP2, an interrupt may occur between the first and second chips CHIP1 and CHIP2, thereby resulting in an occurrence of data collision in the shared bus 840.

Therefore, during data communication between the memory core 860 and one of the chips CHIP1 and CHIP2, the controller 870 in FIG. 20 may determine an access state of the memory core 860, and the controller 870 may adjust or control an access time of one of the first and second chips CHIP1 and CHIP2 to the memory core 860 based on the determined access state of the memory core 860. In more detail, as can be seen from FIG. 20, the controller 870 may adjust or control an access time of one of the first and second chips CHIP1 and CHIP2 to the memory core 860.

In an embodiment, the controller 870 may detect an operation state of the memory core 860, and may output a busy signal (BUSY) to each of the chips CHIP1 and CHIP2, thereby adjusting or controlling an access time between the memory core 860 and one of the chips CHIP1 and CHIP2. When at least one of the buffers B1~B3 is in a write operation mode or in a read operation mode, the controller 870 may activate the busy signal BUSY.

For example, the controller 870 may receive a first write signal NDA_WT and a first read signal NDA_RD that are applied to a first node NDA between the first chip CHIP1 and the first buffer B1, may receive a second write signal NDB_WT and a second read signal NDB_RD that are applied to a second node NDB between the second chip CHIP2 and the second buffer B2, and may receive a third write signal NDC_WT and a third read signal NDC_RD that are applied to a third node NDC, such that the controller 870 may detect an operation state of the memory core 160 and may control the busy signal (BUSY).

Figure 21:
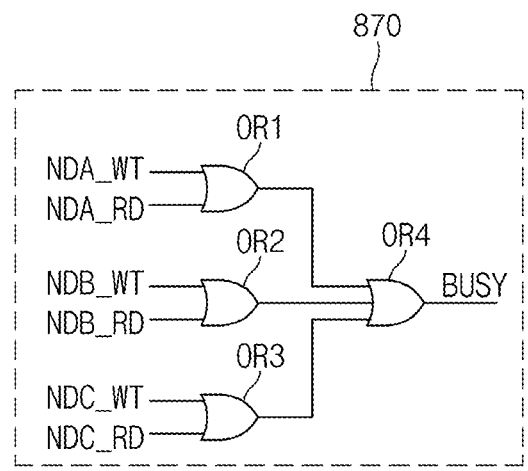
FIG. 21 illustrates a controller shown in FIG. 20 according to an embodiment of the present disclosure.

FIG. 21 illustrates the controller 870 shown in FIG. 20 according to an embodiment of the present disclosure.

Referring to FIG. 21, when one or more of the write signal and the read signal applied to each of the nodes NDA, NDB, and NDC of the stacked memory 800 is activated, the controller 870 may output a busy signal BUSY.

For example, when the busy signal BUSY is deactivated, it may be possible for each of the first and second chips CHIP1 and CHIP2 to access the memory core 860. In contrast, during a read operation or a write operation of the first chip CHIP1, the controller 870 may activate the busy signal BUSY. When the busy signal BUSY is activated, the second chip CHIP2 may determine that the first chip CHIP1 is accessing the memory core 860, and the chip CHIP2 may enter a standby mode without accessing the stacked memory 800. When the first chip CHIP1 receives the activated busy signal BUSY after the first chip CHIP1 has accessed the memory core 860, the first chip CHIP1 may continue to access the memory core 860.

In an embodiment, the controller 870 may include a plurality of logic circuits, for example, a plurality of OR gates OR1~OR4. The first OR gate OR1 may perform a logic OR operation on the first write signal NDA_WT and the first read signal NDA_RD. The second OR gate OR2 may perform a logic OR operation on the second write signal NDB_WT and the second read signal NDB_RD. The third OR gate OR3 may perform a logic OR operation on the write signal NDC_WT and the read signal NDC_RD. The fourth OR gate OR4 may generate a busy signal (BUSY) by performing a logic OR operation on output signals of the plurality of OR gates OR1~OR3.

Figure 22:
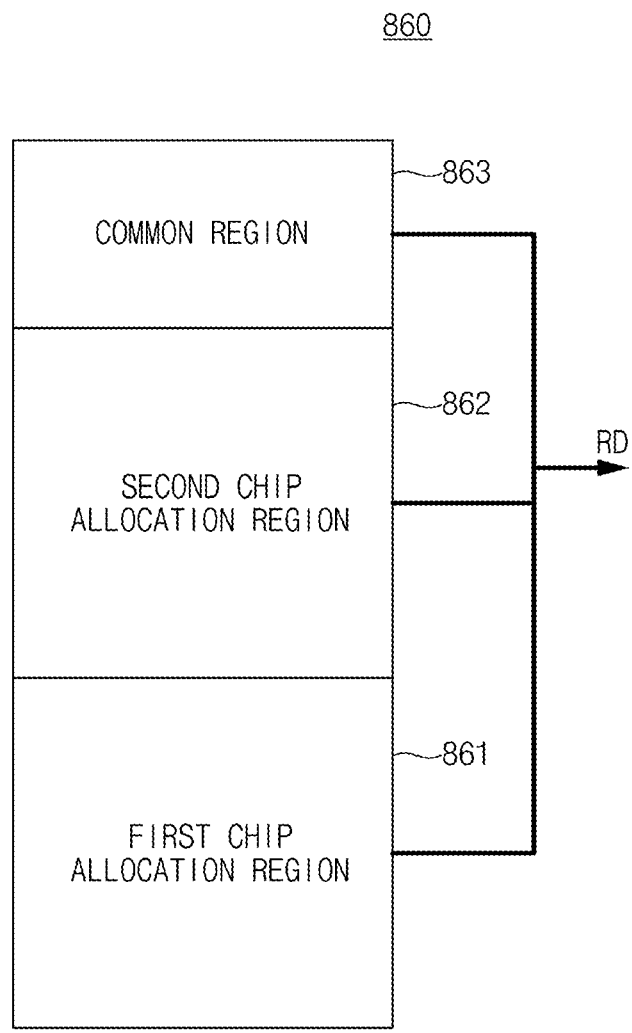
FIG. 22 illustrates a plurality of allocation regions of a memory core suitable for use in the memory shown in FIG. 19 according to an embodiment of the present disclosure.

FIG. 22 illustrates a plurality of allocation regions of the memory core 860 shown in FIG. 19 according to an embodiment of the present disclosure.

Referring to FIG. 22, the memory core 860 may store data received through the shared bus 840 during a write operation, or may output the stored data to the shared bus 840 during a read operation. During the write operation, the memory core 860 may identify a storage region for storing data using a row address, and may allocate data to the identified storage region. The memory core 860 may include a plurality of regions, for example, a first chip allocation region 861, a second chip allocation region 862, and a common region 863.

The memory core 860 may include the first chip allocation region 861 that stores data received from the first chip CHIP1. For example, the first chip allocation region 861 may be a memory region that is allocated to store data received from the first chip CHIP1, rather than from another chip (e.g., the second chip CHIP2).

The memory core 860 may include the second chip allocation region 862 that stores data received from the second chip CHIP2. For example, the second chip allocation region 862 may be a memory region that is allocated to store data received from the chip CHIP2, rather than from another chip (e.g., the first chip CHIP1).

In addition, the memory core 860 may include the common region 863 that stores not only data received from the first chip CHIP1 but also data received from the second chip CHIP2. The common region 863 may be a memory region that is commonly allocated to store data according to resources of two chips CHIP1 and CHIP2. In an embodiment, the common region 863 may include a first portion that stores data received from the first chip CHIP1 and a second portion that stores data received from the second chip CHIP2 and a ratio between the first portion and the second portion of the common region 863 may be dynamically adjusted.

The above-described embodiment of the present disclosure has disclosed that the storage region of the memory core 860 is divided into three division regions for convenience of description and better understanding of the present disclosure. However, embodiments of the present disclosure are not limited thereto, and one or more of the first chip allocation region 861, the second chip allocation region 862, and the common region 863 may be further divided into a plurality of division regions.

In a read operation of the memory M1, the respective chips CHIP1 and CHIP2 may read data RD from any of the first chip allocation region 861, the second chip allocation region 862, and the common region 863 in the memory core 860. In other words, during the read operation of the memory M1, a memory system including the first and second chips CHIP1 and CHIP2 may access all of the first chip allocation region 861, the second chip allocation region 862, and the common region 863 regardless of whether either the first chip CHIP1 or the second chip CHIP2 reads data RD from the memory core 860.

Figure 23:
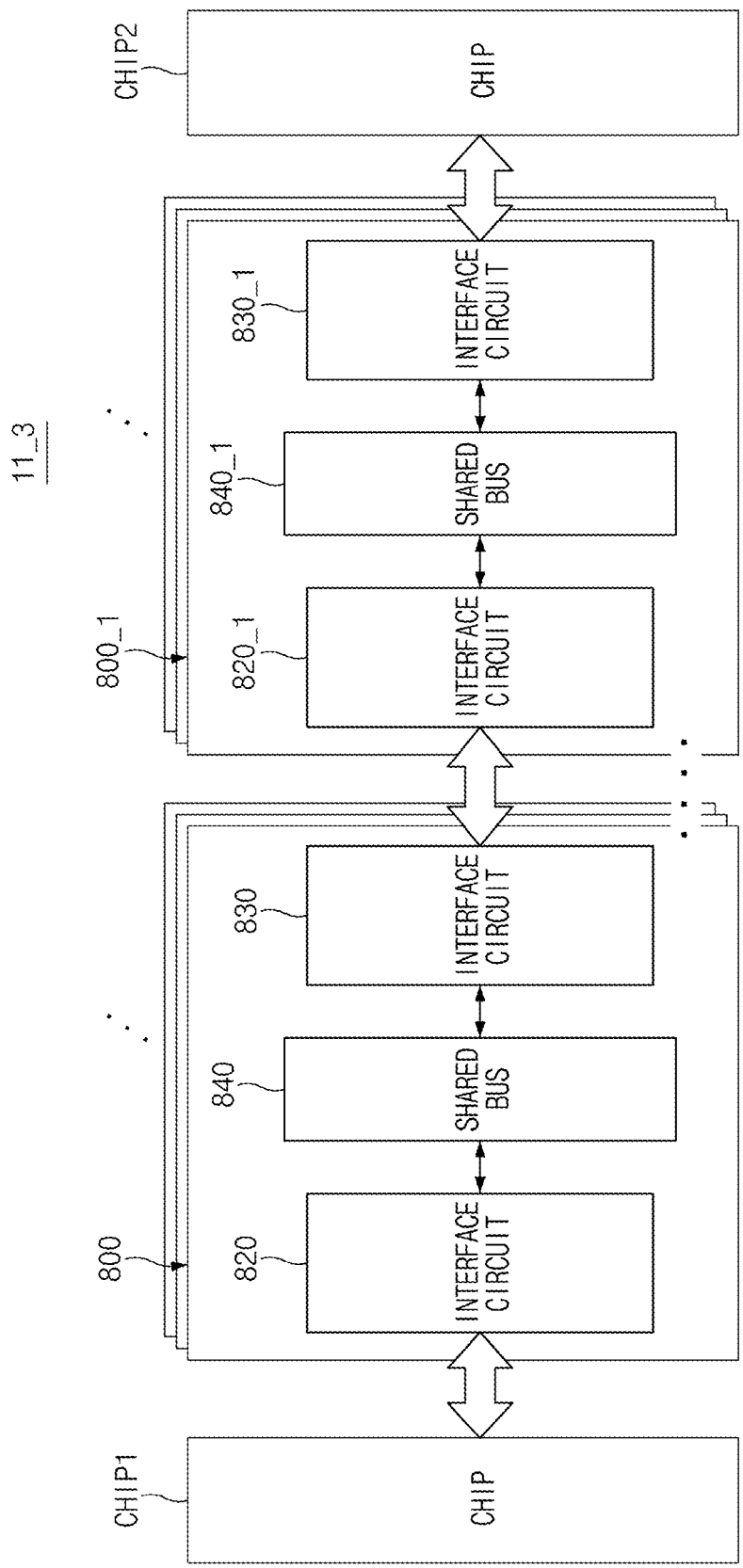
FIG. 23 illustrates a memory system according to another embodiment of the present disclosure.

FIG. 23 illustrates a memory system 11_3 according to another embodiment of the present disclosure.

The memory system 11_3 shown in FIG. 23 may include a plurality of stacked memories, for example, a first stacked memory 800 and a second stacked memory 800_1, whereas the memory system 11_2 shown in FIG. 18 includes a single stacked memory 800. Each of the first stacked memory (or first stacked memory device) 800 and the second stacked memory device (or second stacked memory device) 800_1 includes a plurality of memories (e.g., the memories M1 to M4 in FIG. 18), one or more interface circuits, and a shared bus (e.g., the shared bus 840 in FIG. 18). The remaining constituent elements not shown in FIG. 23 are identical in structure to those of FIG. 18, and thus detailed descriptions thereof will herein be omitted for the interest of brevity.

The memory system 11_3 shown in FIG. 23 may include two stacked memories 800 and 800_1 disposed between the first and second chips CHIP1 and CHIP2 for convenience of description and better understanding of the present disclosure. However, embodiments of the present disclosure are not limited thereto, and three or more stacked memories may also be disposed between the first and second chips CHIP1 and CHIP2.

The first chip CHIP1 and the first stacked memory 800 may be coupled to each other through an interface circuit 820. The first stacked memory 800 may be coupled to each of interface circuits 820 and 830 through a first shared bus 840 embedded therein. The interface circuit 830 of the first stacked memory 800 may be coupled to an interface circuit 820_1 of the second stacked memory 800_1 neighboring the first stacked memory 800.

The second chip CHIP2 and the second stacked memory 800_1 may be coupled to each other through an interface circuit 830_1. The second stacked memory 800_1 may be coupled to each of the interface circuits 820_1 and 830_1 through a second shared bus 840_1 embedded therein.

The first and second stacked memories 800 and 800_1 may be electrically coupled to each other through the interface circuits 820, 830, 820_1, and 830_1 and the first and second shared buses 840 and 840_1. As a result, data may be communicated between the first chip CHIP1 and the second chip CHIP2 through the first and second stacked memories 800 and 800_1.

For example, data may transmitted from the first chip CHIP1 to the second stacked memory device 800_1 through the first stacked memory device 800, and then may be stored in a memory of the second stacked memory device 800_1. Data may be transmitted from the second chip CHIP2 to the first stacked memory device 800 through the second stacked memory device 800_1, and then may be stored in a memory of the first stacked memory device 800.

As described above, the memory system 11_3 according to the embodiment shown in FIG. 23 may include the first and second stacked memories 800 and 800_1 coupled to each other in the form of a chain. However, embodiments of the present disclosure are not limited thereto, and the number of a plurality of stacked memories that share data to make a plurality of chips communicate with each other may be increased.

Figure 24:
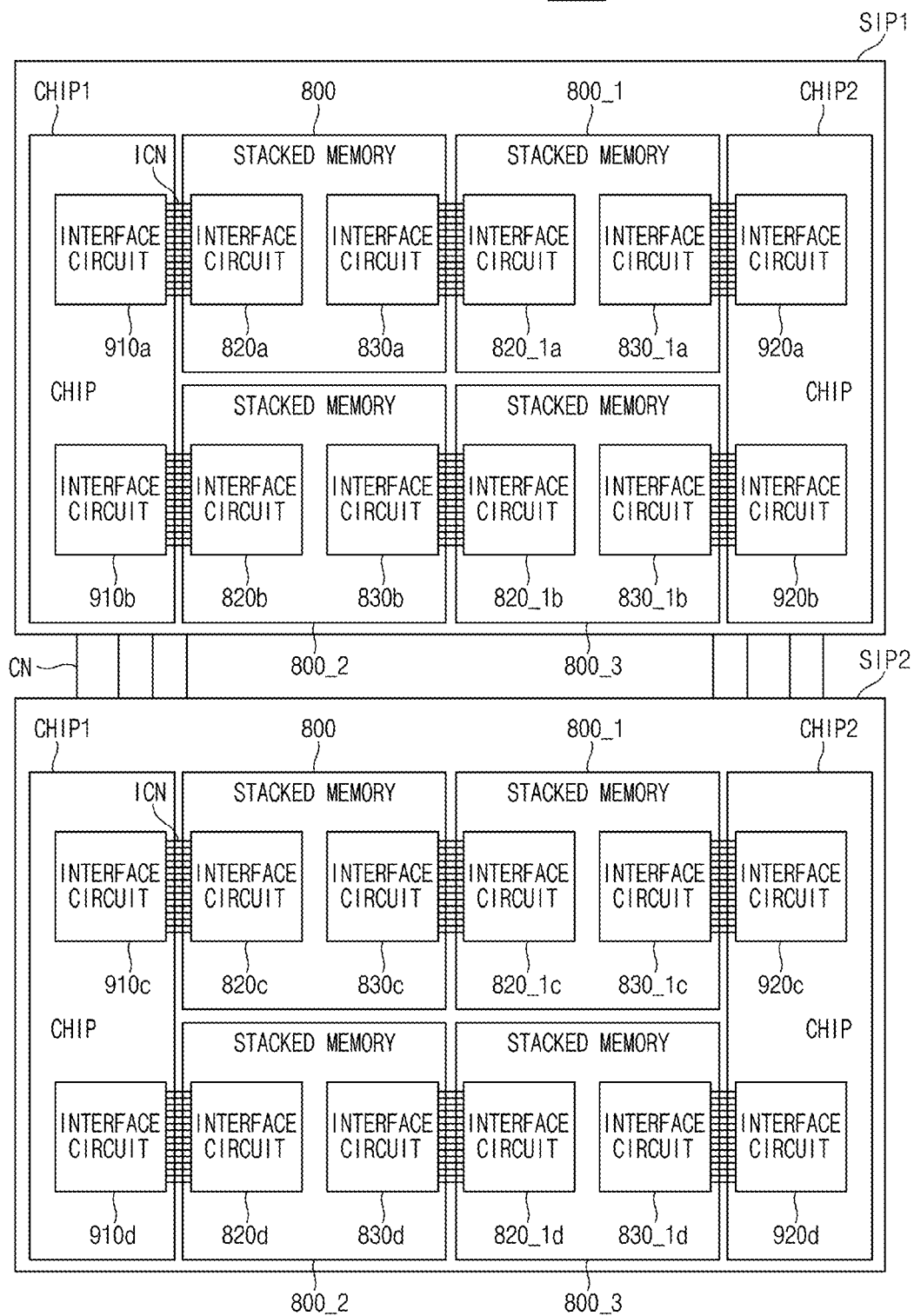
FIG. 24 illustrates a memory system according to still another embodiment of the present disclosure.

FIG. 24 illustrates a memory system 11_4 according to yet another embodiment of the present disclosure.

A plurality of memories may be integrated into a single package, and thus a single packaged product can operate at a high speed, process high-capacity data, and perform multi-functional operations. For example, System In Package (SIP) technology has been developed. In the SIP technology, microprocessor dies and memory dies can be implemented as a System In Package (SIP) using interposer interconnect technology.

The embodiment of FIG. 24 illustrates an example of a memory system 11_4 including at least one system-in-package (SIP). Referring to FIG. 24, the memory system 11_4 may include first and second system-in-packages (SIPs) SIP1 and SIP2. The first and second system-in-packages (SIPs) SIP1 and SIP2 shown in FIG. 24 are substantially identical in structure to each other, and thus only the first system-in-package (SIP) SIP1 will be described hereinafter for convenience of description and better understanding of the present disclosure.

The first system-in-package SIP1 may include first, second, third, and fourth stacked memories (or stacked memory devices) 800~800_3 and first and second chips CHIP1 and CHIP2. Although the first system-in-package SIP1 according to the embodiment shown in FIG. 24 includes four stacked memories 800~800_3 for convenience of description, embodiments of the present disclosure are not limited thereto, and the number of stacked memories 800~800_3 may vary in other embodiments.

The stacked memories 800~800_3 may be disposed between the first chip CHIP1 and the second chip CHIP2. For example, the four stacked memories 800~800_3 may be arranged in row and column directions of a matrix.

The first and third stacked memories 800 and 800_2 may be disposed adjacent to the first chip CHIP1, and the first and third stacked memories 800 and 800_2 may be electrically coupled to interface circuit 910a and 910b of the first chip CHIP1 through interface circuits 820a and 820b, respectively. The second and fourth stacked memories 800_1 and 800_3 may be disposed adjacent to the second chip CHIP2, and the second and fourth stacked memories 800_1 and 800_3 may be electrically coupled to interface circuits 920a and 920b of the second chip CHIP2 through interface circuits 830_1a and 830_1b, respectively. The interface circuit 830a of the first stacked memory 800 and the interface circuit 830b of the third stacked memory 800_2 may be coupled to the interface circuit 820_1a of the second stacked memory 800_1 and the interface circuit 820_1b of the fourth stacked memory 800_3, respectively.

The interface circuits 910a, 910b, 920a, 920b, 820a, 820b, 830a, 830b, 820_1a, 820_1b, 830_1a, and 830_1b included in the first and second chips CHIP1 and CHIP2 and the stacked memories 800~800_3 may be interconnected through an interposer channel ICN. For example, the interface circuit 910a of the first chip CHIP1 may be coupled to the interface circuit 820a of the first stacked memory 800 through one or more interpose channels ICN, the interface circuit 830a of the first stacked memory 800 may be coupled to the interface circuit 820_1a of the second stacked memory 800_1 through one or more interpose channels ICN, and the interface circuit 830_1a of the second stacked memory 800_1 may be coupled to the interface circuit 920a of the second chip CHIP2 through one or more interpose channels ICN. In an embodiment, the interposer channel ICN may correspond to each of the buses BUS1 and BUS2 shown in FIG. 18 or may also correspond to the interface channel 900.

The first system-in-package SIP1 and the second system-in-package SIP2 may be coupled to each other through one or more channels CN. In an embodiment, the channel CN through which the system-in-package SIP1 and the other system-in-package SIP2 are coupled to each other may be implemented using a Printed Circuit Board (PCB).

As is apparent from the above description, a memory system according to embodiments of the present disclosure includes a plurality of chips interconnected through a shared channel within a memory, such that a data transfer rate and data transfer efficiency may be increased and power consumption for data transmission may be reduced.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A data processing system comprising:
   a compute blade configured to generate a write command to store data and a read command to read the data; and a memory blade configured to selectively perform read and write operations in response to the read and write commands in a plurality of memories, wherein the compute blade has a cache memory that stores information about performance characteristics of each of the plurality of memories, and is configured to determine priority information of a memory to which an eviction operation of a cache line is performed based on the performance characteristics, wherein the compute blade is mounted at a first layer, the memory blade is mounted at a second layer that is different from the first layer, and the compute blade communicates with the memory blade by supporting of an interconnect blade, wherein the cache memory includes:
an eviction circuit configured to determine priority information of the memory in response to the performance characteristics, and to perform the eviction operation in the memory according to the determined priority information, wherein, when memories having a slow data access speed are respectively determined to be a first-priority memory and a second-priority memory, the eviction circuit allocates a second priority to a memory having a fast data access speed such that the memory having the fast data access speed is changed to the second-priority memory.

2. The data processing system according to claim 1, wherein the compute blade includes:
a central processing unit (CPU) configured to generate a command to control the memory blade;
the cache memory configured to store data for the central processing unit (CPU) in a cache line, and to determine priority information of a memory to which an eviction operation of the cache line is performed based on the performance characteristics; and
an input/output (I/O) interface between the central processing unit (CPU) and the memory blade.

3. The data processing system according to claim 2, wherein the cache memory further includes:
a way block configured to store cached data for the central processing unit (CPU);
a data processor configured to process data to perform the eviction operation of the cache line; and
a characteristic storage circuit configured to store the performance characteristics.

4. The data processing system according to claim 3, wherein the performance characteristics include any one of a data access speed, a refresh period, and an on-chip leakage amount.

5. The data processing system according to claim 3, wherein the data processor is configured to process the data to perform the eviction operation after determining the priority information of the memory.

6. The data processing system according to claim 3, wherein the data processor replaces the cached data using a Least Recently Used (LRU) operation.

7. The data processing system according to claim 3, wherein the data processor replaces the cached data using a First-In First-Out (FIFO) operation.

8. The data processing system according to claim 1, further comprising:

the interconnect blade configured to communicate data between the compute blade and the memory blade.

9. The data processing system according to claim 1, wherein the memory blade includes:
the plurality of memories in which the read operation and the write operation are performed; and
a controller configured to selectively access the plurality of memories in response to a request received from the compute blade.

10. The data processing system according to claim 9, wherein the controller includes:
a data controller configured to control data that is communicated between the compute blade and the plurality of memories;
a plurality of memory controllers configured to control communication of the data between the data controller and the plurality of memories; and
an input/output (I/O) interface that is an interface between the data controller and the compute blade.

11. The data processing system according to claim 10, wherein:
in response to the write command, the data controller receives data to be written from the compute blade and writes the received data in a first memory from among the plurality of memories; and
in response to the read command, the data controller reads data stored in a second memory from among the plurality of memories and outputs the read data to the compute blade.

12. The data processing system according to claim 1, wherein the plurality of memories include:
a first-group memory in a first temperature environment;
a second-group memory in a second temperature environment; and
a third-group memory in a third temperature environment,
wherein the second temperature is lower than the first temperature and the third temperature is lower than the second temperature.

13. The data processing system according to claim 12, wherein the first-group memory, the second-group memory, and the third-group memory are the same kind of memories.

14. The data processing system according to claim 12, wherein the plurality of memories have different performance characteristics.

15. The data processing system according to claim 12, wherein:
the first-group memory has a first access speed;
the second-group memory has a second access speed faster than the first access speed; and
the third-group has a third access speed faster than the second access speed.

16. The data processing system according to claim 1, wherein the cache memory further includes:
an address decoder configured to decode an address received from a central processing unit (CPU).

17. The data processing system according to claim 3, wherein the data processor is configured to process data after determining the priority information of the memory.

18. The data processing system according to claim 1, wherein the compute blade and the memory blade are mounted into a computing rack to be distinguishable from each other.

* * * * *